(12) United States Patent
Horne et al.

(10) Patent No.: US 7,893,391 B2
(45) Date of Patent: Feb. 22, 2011

(54) POSITIONAL SENSOR FOR SOLAR ENERGY CONVERSION DEVICE

(75) Inventors: William E. Horne, Renton, WA (US); Mark D. Morgan, Seattle, WA (US)

(73) Assignee: Edtek, Inc., Kent, WA (US)

( * ) Notice: Subject to any disclaimer, the term of this patent is extended or adjusted under 35 U.S.C. 154(b) by 0 days.

(21) Appl. No.: 12/484,429

(22) Filed: Jun. 15, 2009

(65) Prior Publication Data

US 2009/0254228 A1 Oct. 8, 2009

Related U.S. Application Data

(62) Division of application No. 11/650,739, filed on Jan. 8, 2007, now Pat. No. 7,612,285.

(51) Int. Cl.
*G01C 21/02* (2006.01)
*H01L 31/042* (2006.01)
*F24J 2/38* (2006.01)

(52) U.S. Cl. ............... 250/203.4; 136/246; 126/573

(58) Field of Classification Search .......... 250/203.4, 250/206.1, 206.2; 356/139.01, 139.02; 136/246; 126/573–578

See application file for complete search history.

(56) References Cited

U.S. PATENT DOCUMENTS

| | | |
|---|---|---|
| 4,074,704 A | 2/1978 | Gellert |
| 4,086,485 A | 4/1978 | Kaplow et al. |
| 4,146,408 A | 3/1979 | Nelson |
| 4,249,516 A | 2/1981 | Stark |
| 4,419,532 A | 12/1983 | Severns |
| 4,549,078 A * | 10/1985 | Monahan ............ 250/203.1 |
| 4,746,370 A | 5/1988 | Woolf |
| 4,812,030 A | 3/1989 | Pinson |
| 4,837,451 A | 6/1989 | Pinson |
| 5,882,434 A | 3/1999 | Horne |
| 7,612,285 B2 | 11/2009 | Horne et al. |

(Continued)

FOREIGN PATENT DOCUMENTS

DE 4423778 A1 * 1/1996

(Continued)

OTHER PUBLICATIONS

"U.S. Appl. No. 11/650,739, Preliminary Amendment mailed Apr. 11, 2007", 24 pgs.

(Continued)

*Primary Examiner*—Thanh X Luu
(74) *Attorney, Agent, or Firm*—Schwegman, Lundberg & Woessner, P.A.

(57) ABSTRACT

A positional sensor for a solar energy collection device includes a fine sensing device having first light-sensitive sensors supported above a base so that adjacent first light-sensitive sensors are oriented in mutually orthogonal directions at a sensor height above the base. The first light-sensitive sensors are positioned at oblique angles relative to the base. The sensor also includes a coarse sensing device having a light-opaque shield surrounding the first light-sensitive sensors that extends outwardly from the base to a height that is greater than the sensor height. The shield includes second light sensing devices directed outwardly from the shield and arranged so that adjacent second light-sensitive sensors are oriented in mutually orthogonal directions.

20 Claims, 16 Drawing Sheets

U.S. PATENT DOCUMENTS

| | | |
|---|---|---|
| 2007/0215199 A1* | 9/2007 | Dold et al. .................. 136/246 |
| 2008/0163922 A1 | 7/2008 | Horne et al. |
| 2009/0205700 A1 | 8/2009 | Horne et al. |
| 2009/0225426 A1 | 9/2009 | Horne et al. |
| 2009/0266404 A1 | 10/2009 | Horne et al. |

FOREIGN PATENT DOCUMENTS

| | | | |
|---|---|---|---|
| JP | 2002222015 A | * | 8/2002 |
| WO | WO-2008086278 A3 | | 7/2008 |

OTHER PUBLICATIONS

"U.S. Appl. No. 11/650,739, Non-Final Office Action mailed Apr. 10, 2009", 31 pgs.

"U.S. Appl. No. 11/650,739, Notice of Allowance mailed Aug. 31, 2009", 9 pgs.

"U.S. Appl. No. 11/650,739, Response filed May 28, 2009 to Non-Final Office Action mailed Apr. 10, 2009", 16 pgs.

"International Search Report and Written Opinion dated Jul. 18, 2008, PCT Application No. PCT/US08/50392 filed Jan. 7, 2008", 14 pgs.

* cited by examiner

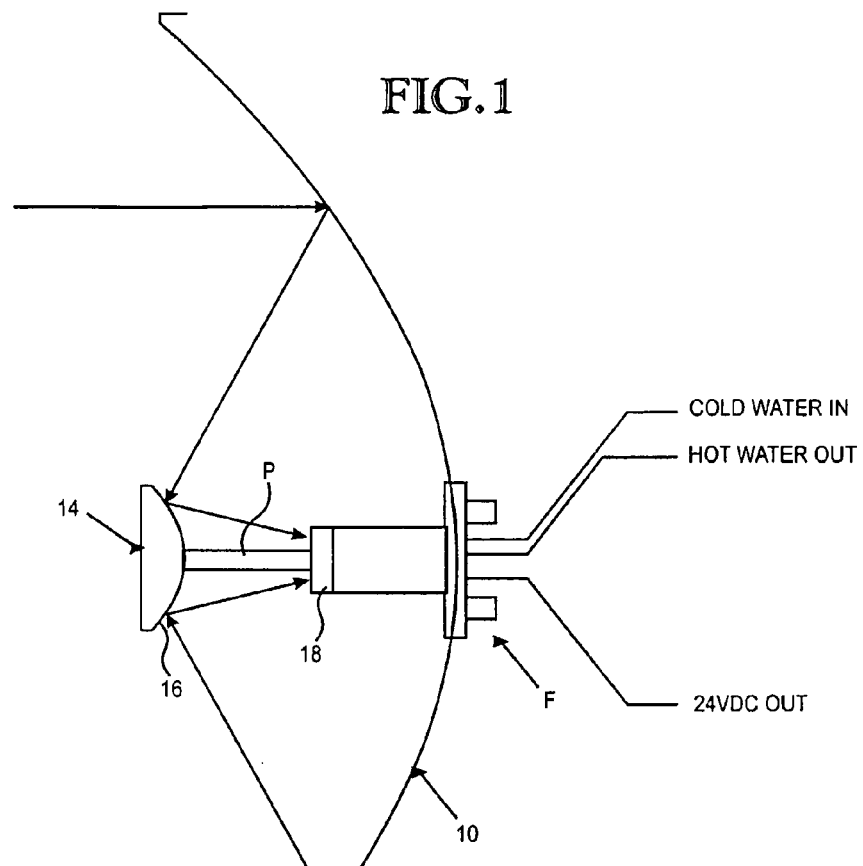
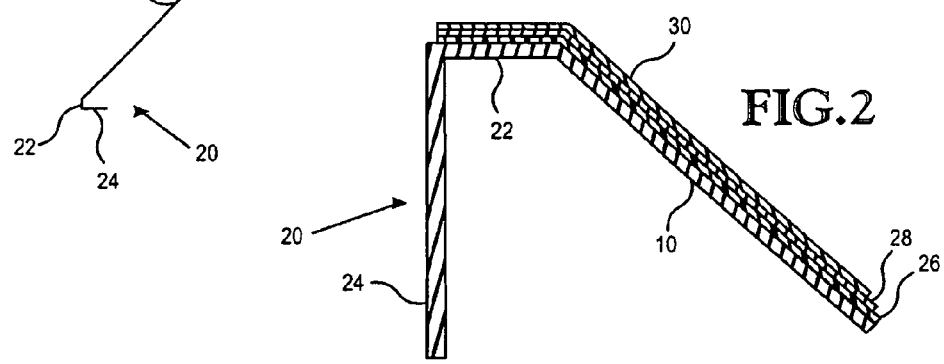

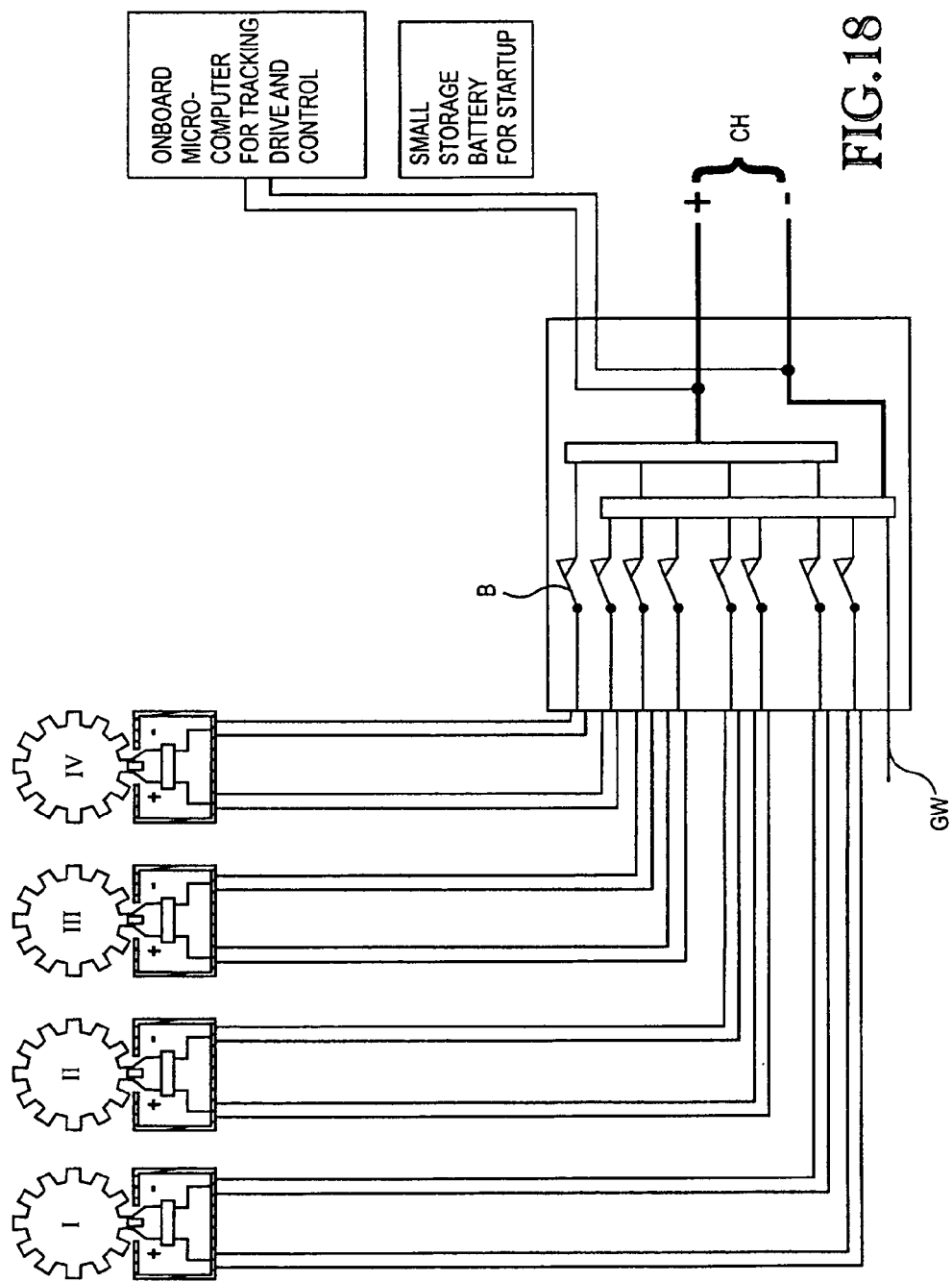

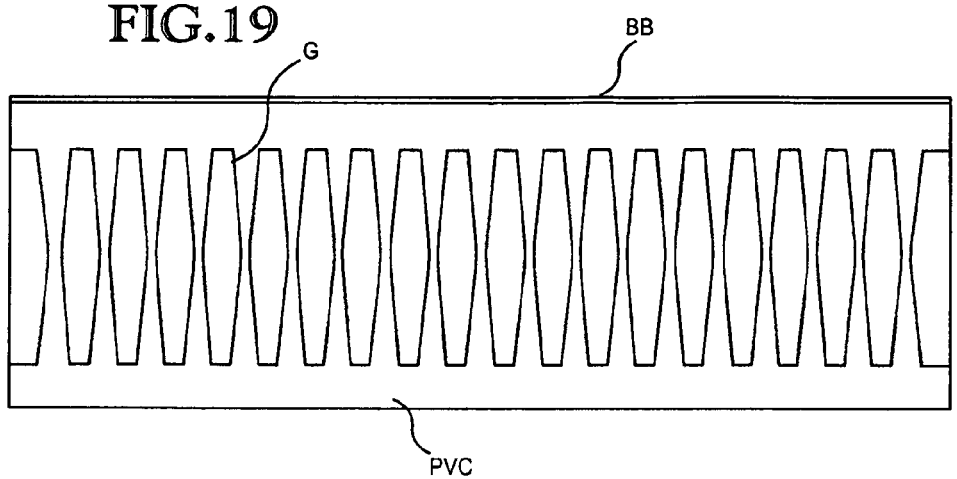
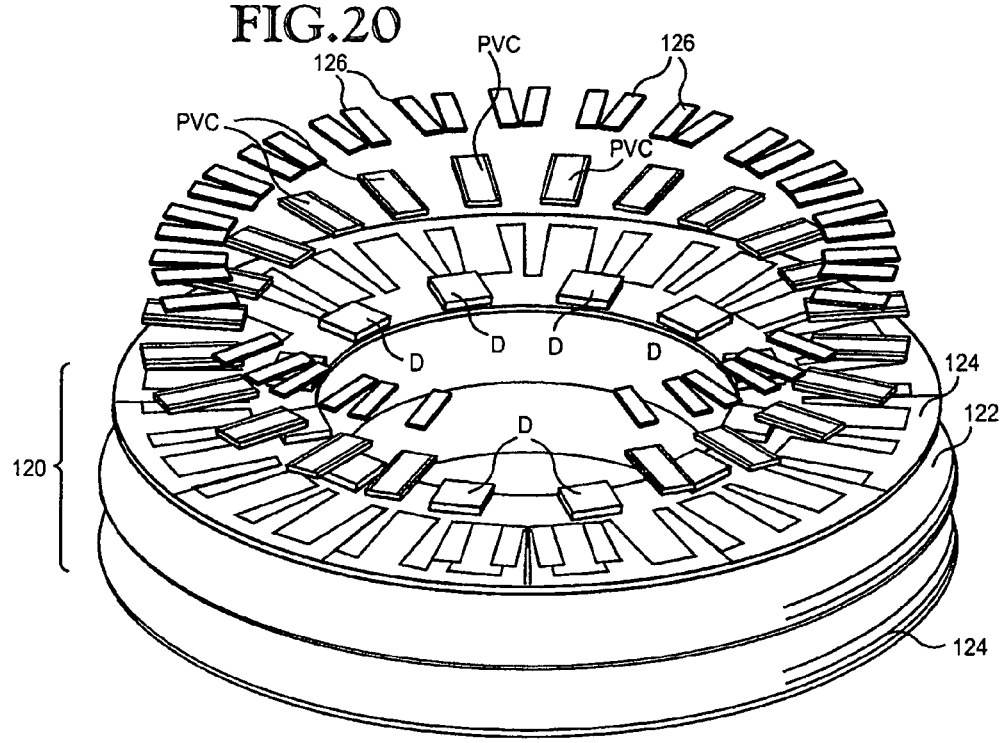

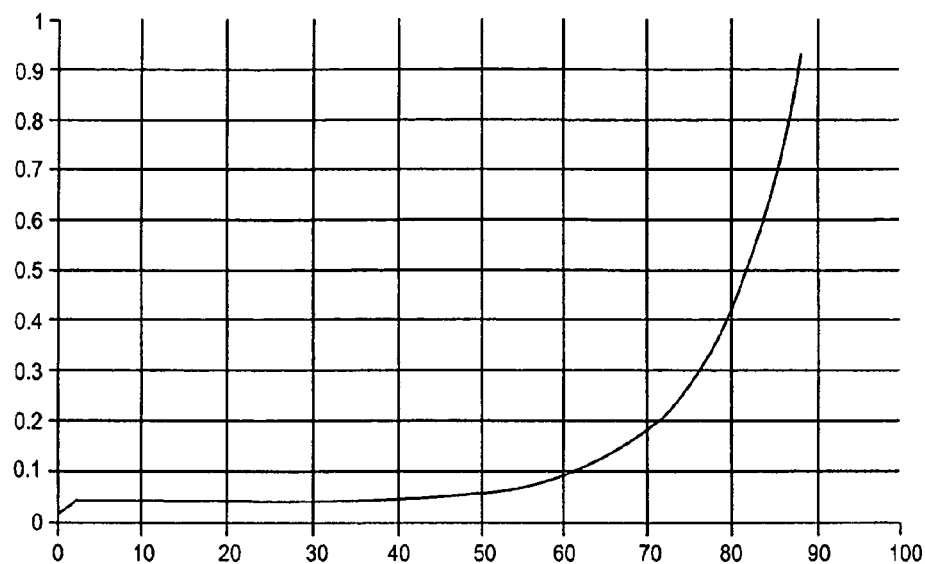
FIG.23
FIG.24
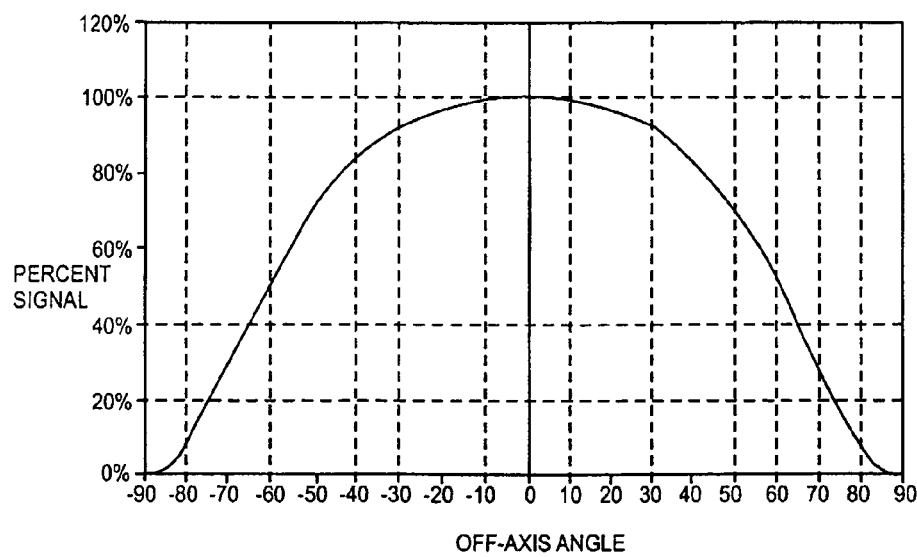

POSITIONAL SENSOR FOR SOLAR ENERGY CONVERSION DEVICE

CLAIM OF PRIORITY

This application is a divisional of U.S. Application Ser. No. 11/650,739, filed Jan. 8, 2007, which issued as U.S. Pat. No. 7,612,285, and which is incorporated herein by reference in its entirety.

TECHNICAL FIELD

Improvements in the conversion of solar energy to electrical and/or heat energy are described. More particularly, a system of mirrors and lenses/prisms for economically collecting solar energy and converting it to electrical and/or heat energy is described.

BACKGROUND

Solar energy has been a desirable energy source for over thirty years. However, cost has always been an obstacle to its widespread use. The most familiar solar energy systems comprise an array of solar cells that cover enough area, or intercepts enough incident sunlight, to yield the desired amount of electrical power at relatively low conversion efficiencies of ten to fifteen percent (10%-15%). This approach requires large areas of expensive semi-conductor solar cells. To date, these systems have been uncompetitive without cost subsidies of some sort. In general, the prohibitive cost of solar energy systems has been primary due to the cost and the quantities required of the semi-conductor conversion devices called solar cells. There have been several approaches to alleviating the cost issue. One approach is to fabricate thin-film solar cells that use only a minimal amount of semi-conductor material. Unfortunately, this approach generates still lower efficiencies, six to eight percent (6%-8%) and the materials have proven to be problematic. A second approach has been used various optical devices such as fresnel lenses or mirrors to concentrate the solar energy to higher intensity and then convert it using a smaller area of the expensive solar cells. All of these approaches have been, and are still being pursued. None to date have resulted in economical solar energy generation without some sort of financial incentives being offered by the utilities or by government agencies. There is a need for a more economical way of collecting solar energy and converting it into electrical and/or thermal energy.

BRIEF SUMMARY

The solar energy collection system according to the various embodiments comprises a primary mirror and a secondary mirror. The primary mirror has a concave specular surface constructed and positioned to receive solar energy and focus it towards a focal point. The secondary mirror has a convex specular surface constructed and positioned to receive focused solar energy from the primary mirror and refocus it onto an annular receiver.

In an embodiment, the annular receiver includes an annular array of optical elements constructed to focus the solar energy received from the secondary specular surface onto a ring of discrete areas. In the various embodiments, a ring of solar-to-electrical conversion units are positioned on the ring of discrete areas.

In the various embodiments, the concave specular surface of the primary mirror is substantially parabolic. The convex specular surface of the secondary mirror is a hyperbolic surface modified to refocus the solar energy onto the annular receiver.

In the various embodiments, the annular receiver comprises a pattern of lenses/prisms arranged to further concentrate the solar energy and deliver it onto an annular array of photovoltaic cells.

The various embodiments also include methods of making the primary and secondary mirrors. It also relates to a relationship between the secondary mirror and an optical concentrator, and between the optical concentrator and a system of photovoltaic cells. The photovoltaic cells serve a dual function in the system. They absorb the concentrated sunlight and convert a portion of it to electricity and a portion to heat, or thermal energy. Thus, it serves as both an electrical generator and a heat generator. In order to accomplish these two roles efficiently, the photovoltaic cells are fabricated for semiconductor materials with sufficiently wide band gap to maintain the efficient electric conversion at relatively high temperatures. In general, the wider the band gap of the semiconductor material, the less the photovoltaic cells efficiency will be degraded with rising temperature. A tradeoff is required for the application being considered depending on the relative importance of electricity production and heat production.

The various embodiments provide a mirror that is composed of a thin metal body having a curved specular surface, comprising a polymer layer on said metal body surface, a reflective metal layer on the polymer layer, and a thin glass layer on the metal layer. This construction can be used for both the primary mirror and the secondary mirror.

In the various embodiments, the thin-metal body of the mirror is formed from sheet aluminum alloy. A particularly suitable alloy is aluminum alloy 6061 that has been hardened to a T-6 condition. The thin metal body is formed into a desired shape and then is rotated while the polymer layer, the reflective metal layer and the thin glass layer are successively applied to it.

In the various embodiments, the specular surface of the secondary mirror is a convex surface that has been shaped to cause it to reflect and focus light/heat energy received by it onto an annular focus area.

In the various embodiments, a system lends itself well to wide band gap photovoltaic cells having both single and multiple tandem junctions. To date, the cost of photovoltaic cells made from wide band gap materials and in multi-junction configurations has precluded use in terrestrial applications. The concentrator system produces a very high light intensity and allows the use of a small, economical area of photovoltaic cells.

The various embodiments include a unique design of high intensity photovoltaic cells. These cells have unique, long and narrow active areas that are optimum for two reasons. Firstly, the cell pattern corresponds to the illumination pattern provided by the tertiary concentrator lenses. Secondly, the cell pattern provides a very short path length for conducting the photo-generated current off the cells. Photovoltaic cells under light concentration operate very large currents at low voltage. Therefore, any series resistance in the cell would drop the voltage and, in turn, the efficiency of the cells. The current from the high intensity cells is collected and conducted off of the cells by means of a pattern of electrically conducting metal grids overlaying the active areas of the cells. The series resistance in the grids is proportional to the length of the grids. For this reason, the large narrow cell design with its electrical bus bar running parallel to the long dimension of the cells permits the necessary short conductor grids. As will hereinafter be described, the various embodiments include a construction of the photovoltaic cells and the pattern of such cells.

In the various embodiments, a solar energy conversion system converts solar to thermal energy in the form of hot water at useful temperatures while simultaneously converting solar power to electrical power at high efficiency. In the system, the concentrated solar energy is first absorbed by the photovoltaic cells. The photovoltaic cells convert a portion of the absorbed energy to electricity because the photovoltaic cells are made from wide band gap semiconductor materials, they can maintain high efficiency even at elevated temperatures.

In the various embodiments, a sensor and control system consisting of a sun sensor may be provided to supply sun position signals to a microcomputer that processes information and sends control signals to gear motors that drive the concentrators and hold them locked onto the sun to an accuracy of +/−0.1 degrees. The micro computer system further serves to shut the system down at night and position the primary mirrors to face the ground, wake the system up in the morning and acquire the sun, monitor the photovoltaic cell temperatures and drive the concentrators off sun if the cells overheat, monitor wind speed and rotate the concentrator mirrors to face down (edge-on to the wind) if wind speed exceeds a threshold amount.

Other objects, advantages and features will become apparent from the description set forth below, from the drawings, and from the principles that are embodied in the specific structures that are illustrated and described.

BRIEF DESCRIPTION OF THE SEVERAL VIEWS OF THE DRAWINGS

Like reference numerals and letters refer to like parts throughout the several views of the drawing, and:

FIG. 1 is a sectional schematic view of an embodiment;

FIG. 2 is an enlarged scale fragmentary view of an edge portion of FIG. 1, such view showing a thin metal mirror body, a polymer layer on the body, a reflective metal layer on the epoxy polymer layer, and a thin glass layer on the metal layer;

FIG. 18 is a schematical view of the electrical components of a system that includes four of the solar collection systems shown by FIG. 1;

FIG. 19 is a plan view of a unique photovoltaic cell that operates efficiently at very-high light intensities;

FIG. 20 is an exploded pictorial view of a circular array of the photovoltaic cells shown by FIG. 19 together with cell interconnects, protective diodes, a circuit etched in a copper laminate, a ceramic substrate and another copper laminate below the ceramic substrate;

FIG. 23 is a graph showing a typical reflectance curve for glass as a function of the angle of incidence of incoming light;

FIG. 24 is a graph showing the signal produced in a glass covered solar cell as a function of angle;

DETAILED DESCRIPTION

Figure 3:
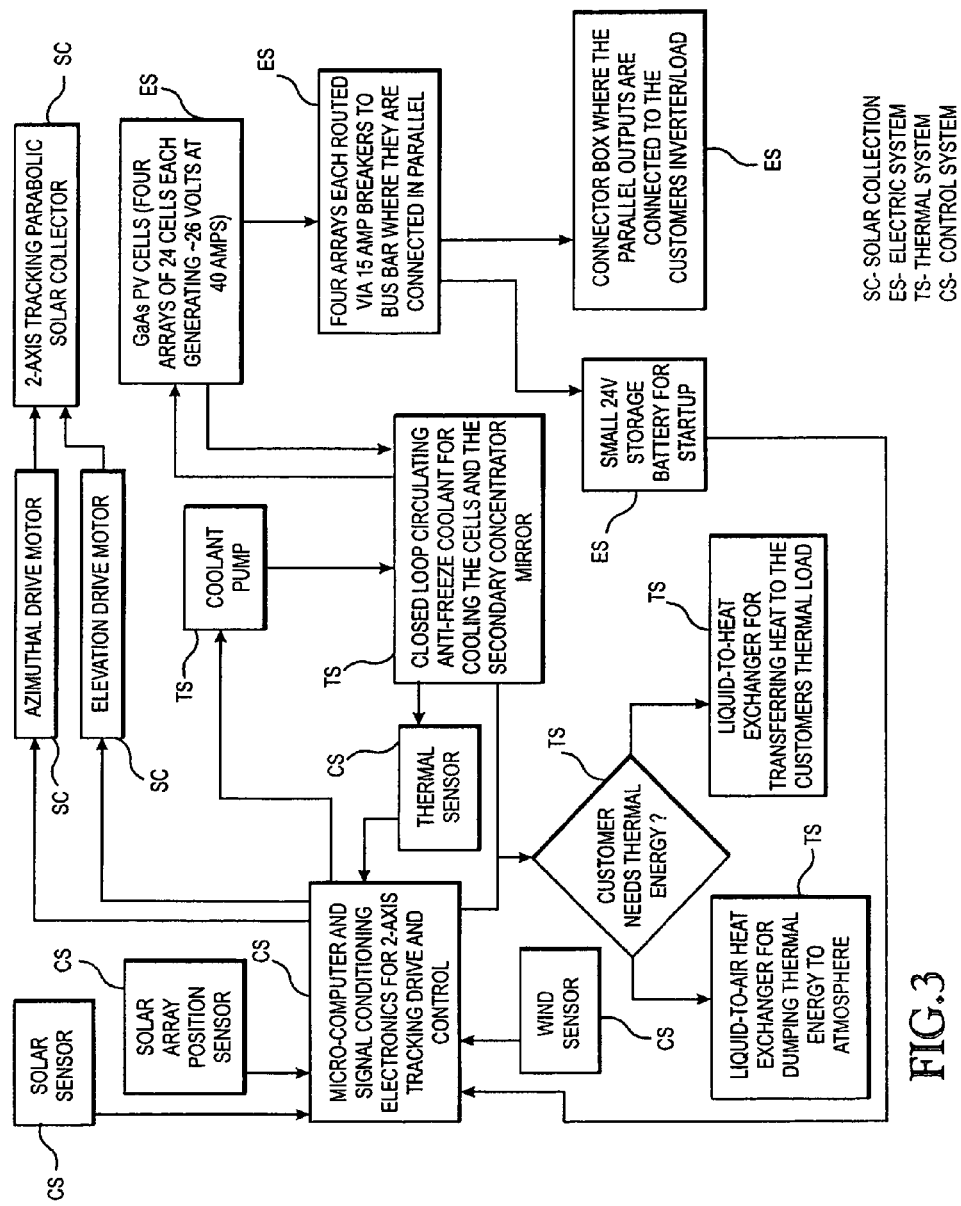
FIG. 3 is a block diagram of a total system embodying solar collection, electrical, thermal and control components.

FIG. 1 is a schematic view of the optical components of the illustrated embodiment. It comprises a primary mirror 10, a secondary mirror 14 and an optical concentrator 18. Primary mirror 10 is a concave/convex dish that has a specular surface 12 on its concave side. Secondary mirror 14 is a concave/convex dish having a specular surface 16 on its convex side. The convex side 16 of mirror 14 confronts the concave side 12 of the mirror 10. The concave specular surface 12 is preferably parabolic and the specular surface 16 is generally hyperbolic. The substantially parabolic surface 12 is shaped to focus axially collimated sun rays to a focus point co-planar to its rim 20. This focal point is coincident with the virtual focal point of a generally hyperbolic specular surface 16 of the secondary mirror 14. Specular surface 16 is constructed and positioned to concentrate the solar energy that it receives from the primary mirror surface 12 and concentrate it onto an annular area at one end of an optical concentrator 18. As will hereinafter be described in detail, concentrator 18 is composed of an annular array of lenses/prisms 100 that further concentrate the solar energy onto a ring of discrete areas.

Photovoltaic cells PV are positioned on the discrete areas for absorbing the concentrated solar area and converting it to electricity and heat.

In FIG. 3, the solar collection portion of the system is designated SC. The electrical portion of the system is designated ES. The thermal portion of the system is designated TS. The control portion of the system is designated CS.

Preferably, the primary mirror 10 is constructed from a sheet of aluminum alloy that has been formed to give it a substantially parabolic, convex/concave shape and a circular rim 20 composed of radial and cylindrical flanges 22, 24. As will hereinafter be described in more detail, an epoxy polymer layer 26 is deposited on the concave surface 12 (FIG. 2). This is followed by a vapor deposition of a thin film 28 of reflective metal on the polymer layer 26. Then, to protect the metal layer 28 from corrosion and oxidation, a thin glass layer 30 is deposited on the metal layer 28. This protects the metal layer 28 from weather, abrasion and cleaning.

The secondary mirror 14 is preferably also formed by a thin sheet of an aluminum alloy that is shaped to provide it with a modified hyperbolic specular surface. As with the primary specular surface 12, the secondary specular surface 16 is provided with a layer of polymer over the formed sheet of aluminum. Then, a reflective metal layer is applied to the polymer layer and a thin glass layer is applied to the metal layer.

The primary and secondary mirrors 10, 14 are supported by a common frame F to which the primary mirror 10 is connected by plates 86, 88 and a series of fasteners (not shown). This frame F includes an axially extending post P which is coincident with a common center line axis of the two mirrors 12, 16. The annular array of lenses/prisms 100 forming a part of the concentrator 18 surround the post P. As will hereinafter be explained in greater detail, the modified hyperbolic surface 16 is constructed and positioned to focus the solar energy onto the annular ring of lenses/prisms that are a part of concentrator 18. The secondary mirror 14 may include a housing on its concave side constructed to receive a cooling fluid.

The primary mirror 10 may be formed by hot blow forming a heated sheet of aluminum into a die that is precisely machined to the desired parabolic shape. The hot blow forming process is so named because it uses gas pressure to force the heated sheet into conformance with the die. Forming the sheet at high temperature allows the use of off-the-shelf rolled aluminum sheet for substrate stock. The high forming temperature lowers the tensile strength of the material, so that the internal stresses that cause spring back from the die are minimized. The lowered tensile strength also minimizes variations in spring back due to differences between batches of materials or in materials from different vendors. The gas pressure presses equally on all parts of the sheet ensuring that all areas of the material are precisely conformed to the die and is left very precisely conformed to the shape of the forming die. After the forming process, the formed part is in a soft ("T-0") annealed condition. The soft condition is undesirable and can be avoided by the selection of a suitable alloy and appropriate forming conditions so that age hardening, or tempering, can occur in the part after it is removed from the die and cooled.

Figure 4:
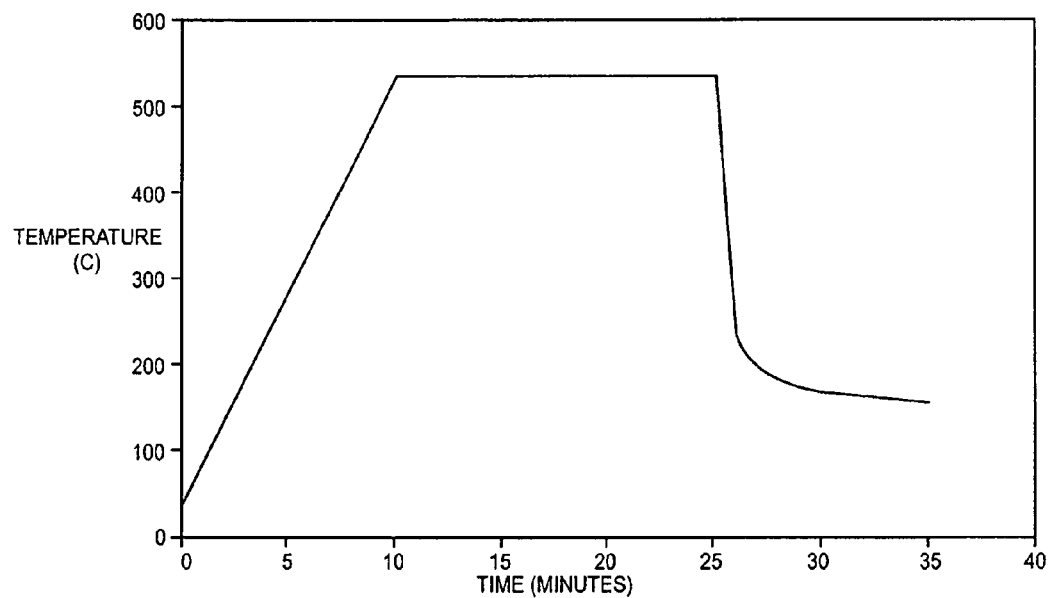
FIG. 4 is a graph of temperature vs. time presenting time/temperature characteristics for quenching 6061 aluminum alloy.
Figure 5:
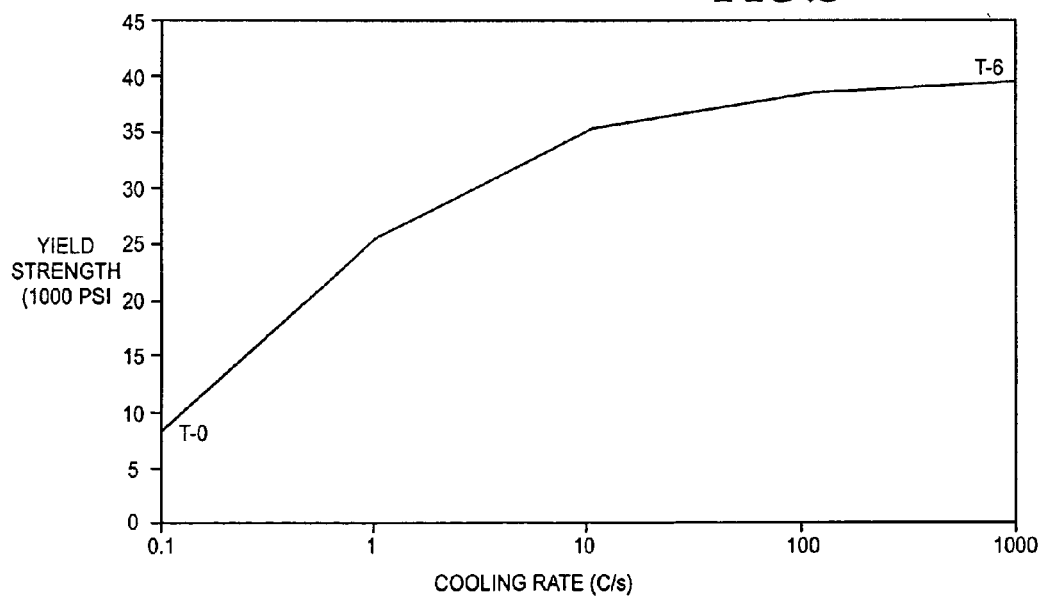
FIG. 5 is a graph of yield strength vs. cooling rate showing relative strengths of 6061 aluminum alloy as a function of quenching parameters.

Aluminum alloy 6061 is a suitable material to utilize the age hardening process. Age hardening the formed aluminum part to its T-6 condition makes it about five times harder, or stiffer, than it was in the T-O (soft annealed) condition. Aluminum alloy 6061 is an excellent choice for age hardening because of its relatively slow impurity precipitation rate during cooling. FIG. 4 illustrates the solid state properties of the material as a function of average cooling rate between the critical temperatures of 400 and 290° C. Generally, soaking the primary concentrator (mirror) at temperature for fifteen (15) minutes is sufficient to set up the age hardening conditions. Once the required solid solution of impurities is obtained, cooling, or quenching, the aluminum rapidly enough, prevents the impurities from precipitating out of solution and yields a supersaturated alloy. After the part is cooled, the impurities slowly precipitate to relieve the supersaturated condition. This results in a non-equilibrium, unstable, microstructure that will, over a period of hours to weeks (depending on the temperature) decompose into a multiphase system with the precipitated impurities creating lattice strains and distortions which harden the aluminum to the rigid and strong T-6 condition. FIG. 5 illustrates the relative strengths of the 6061 alloy as a function of average cooling rate between the critical temperatures of 400 and 290° C.

The conditions for heating and cooling are established for the 6061 aluminum alloy to be both precisely formed without spring back and to induce age hardening. The conditions for both the forming and quenching must be achieved in the forming die. This is achieved by thermally isolating the aluminum sheet blank in the forming chamber and using radiant heating to raise the aluminum sheet to the 536 C solution temperature. The part is then rapidly blown into a steel die that is maintained at a temperature of 225° C. that is below the critical temperature for precipitation in the aluminum alloy. The aluminum sheet rapidly gives up its heat to the die and is cooled to the point required for age hardening.

The forming machine performs a number of functions in the process of heating, forming and then quenching the primary mirror. It thermally isolates the dish blank to allow heating. It forms a gas-tight seal between the blank and the die. It forms a stiffening ring around the outer edge of the disk, forcing the blank material into the die and holds it in place as the die cools the formed dish to set-up the age-hardening condition. The formed primary mirror is removed from the forming machine and stored for age hardening before a specular surface is formed.

Figure 6:
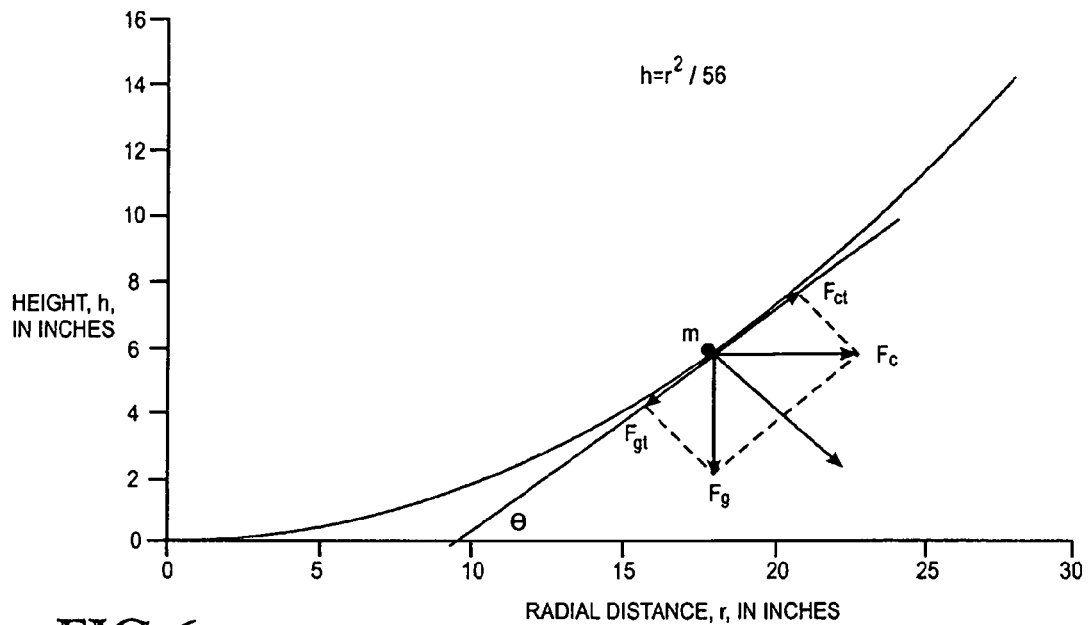
FIG. 6 is a diagram of the forces involved with spinning a smooth polymer coating onto the parabolic surface of the primary mirror.

A specular surface is formed on the concave side of the formed aluminum body 10. This is done by spinning the thin metal body 10 and applying to it a layer of polymer. A liquid polymer is placed at the center of the dish which is then spun about its geometrical axis to a rotational speed such that centrifugal force causes the liquid to flow outwardly and upwardly along the surface of the dish 10 to its outer rim 20. When the entire concave surface 12 of the primary mirror 10 is covered with a film of the liquid polymer, the dish spin rate is adjusted so that centrifugal forces exactly cancel gravitational forces. At this point, there are no net forces on the liquid so that it becomes a stationary parabolic sheet 26 with its surface tension smoothing it to specularity. The condition of no net forces on the liquid is shown in FIG. 6. The required spin conditions for the fluid can be calculated as shown below.

FIG. 6 illustrates the conditions to be met relative to the curvature of the parabolic dish. The origin is assumed to be at the center of the dish, the axis if normal to the origin, the radius, $R_{max}$ is 28 inches and the rim height, $H_{max}$ is 14 inches. Thus, the parabolic curvature is described by $$h = 1/56 r^2 \tag{1}$$

and $$dh/dr = r/28 = \tan\theta \tag{2}$$

where h is the height above the origin and r is the radial distance from the origin. Then the tangential gravity (centripetal) force is $$F_{gt} = F_g \sin\theta = mg \sin\theta \tag{3}$$

where $F_{gt}$ is the tangential component of the gravitational force, $F_g$ is the total gravitational force, $\theta$ is angle of the tangent to the curve with respect to the horizontal, m is the incremental mass of the fluid and g is the gravitational constant. Then the tangential centrifugal force is $$F_{ct}=mrw^2 \cos \theta \quad (4)$$

where $F_{ct}$ is the centrifugal force and w is the angular velocity of the spinning dish.

By equating equations (3) and (4) and solving for w we get $$w=\sqrt{g/28} \text{ radians or rpm}=60/2\pi\sqrt{g/28} \quad (5)$$

When this rotational speed condition is met then the fluid remains stationary at all points on the substrate surface and has no tendency to run. By the same token, since the derivation is based on the starting premise of a parabolic curvature then the fluid seeks to fulfill the parabolic curve and can actually correct for small forming flaws in the starting substrate.

The liquid polymer also has certain requirements that must be fulfilled to properly function in the above application. The polymer property requirements are (1) the viscosity must be sufficiently low to allow easy flow over the surface of the dish, (2) the working time must allow vacuum out-gassing for bubble removal as well as spinning the material onto the dish, (3) it permits a thermally activated cure, (4) cured material must be vacuum compatible, (5) cured material must withstand the heat of vacuum vapor disposition of metal and dielectric layers, (6) it must support these deposited layers without wrinkling and (7) the cured material must be tolerate of humidity and thermal cycle during normal service.

The integrated manufacturing process produces a primary mirror 10 that is durable, economical, precisely formed, and optically superior. The key steps of the manufacturing process are forming the shape, smoothing the surface and deposition of the highly reflective metal and protective glass layers. The reflective metal layer is deposited onto the cured polymer, smoothing layer during a high-vacuum deposition process. During a single vacuum pump-down process, both the highly reflecting metal surface and the protective glass layer are deposited. A critical aspect of the deposition of the metal and glass layer is to deliver additional energy to the layers as they are being deposited on the mirror substrate. The added energy is delivered to the surface by ionizing a portion of the material being deposited and then accelerating these ions towards a surface where the films are being grown. These ions release their kinetic energy to the growing film allowing lateral movement of deposited material to density the growing film, minimize pinhole formation, enhance film adhesion and form a bulk-like layer.

Figure 7:
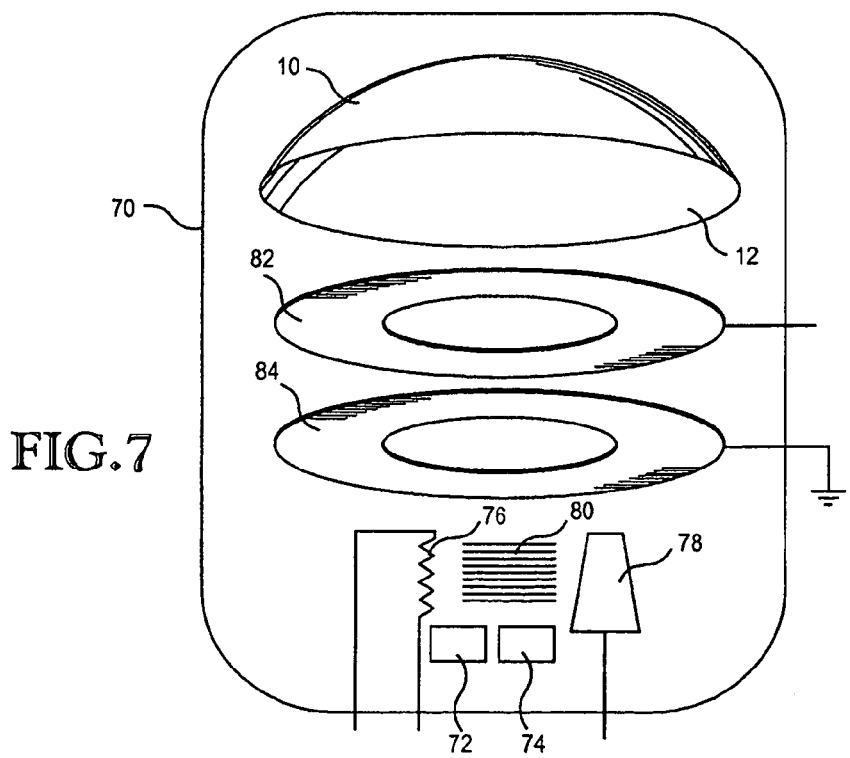
FIG. 7 is a schematic diagram of a vacuum deposition chamber and ion-assisted deposition elements.

Deposition of the metal and glass layers is accomplished in a high-vacuum chamber, schematically shown by FIG. 7. The process begins with the smoothed primary mirror 10 being introduced into a vacuum chamber 70 and sufficient gases being removed from the chamber 70 to yield a pressure of 4.0×10−6 torr. The reflective layer is evaporated by heating a crucible containing metallic aluminum or silver to the point of vaporization of the metal. The metal evaporant is allowed to pass through a stream of energetic electrons thereby partially ionizing metal evaporant. Non-ionized metal vapor proceeds to the primary concentrator substrate where it condenses. An electrical field present in the chamber 70 accelerates the ionized evaporant toward the primary concentrator substrate with this extra energy of acceleration being deposited on the surface once the ions reach their destination.

Ion bombardment has long been used for improving vapor deposited thin films. However, the known processes typically use a beam of ionized gas, atoms or molecules for the bombardment. The beam approach is very expensive and not very practical for bombarding such large areas as the parabolic primary mirror. For this reason, we originated a unique system for ionizing a portion of the evaporant beam and accelerating it towards the target film to achieve the same results. A schematic of the ionizing deposition system is shown in FIG. 7. The system is made up of a sufficiently large vacuum chamber 70 to allow the primary mirror 10 to be enclosed within the chamber. Both a metal evaporant source 72 and a glass evaporant source 74 are provided and used. Filament 76 is heated via an electrical current such that electrons are released from the filament. Anode 78 is placed opposite the filament and given an electric charge to attract electrons released from the filament. The electron stream 80 is allowed to pass through the evaporant stream issuing from either the metal or glass evaporation source. Typically, an electron current of 100 to 500 mA is sufficient to partially ionize the evaporant exiting the sources. Both ionized and non-ionized evaporant moves toward the substrate. Plate 82 is located between the sources/filament and the substrate. This plate 82 is charged to a high voltage to accelerate the ionized evaporant and thereby impart extra energy to the evaporant stream. An additional plate 84 connected to ground, is located between the charge plate 82 and the filament to reduce the number of electrons being diverted away from the evaporation source. The substrate 10 is kept at ground potential for safety reasons.

The glass layer 30 is deposited in a similar fashion with the exception that a silicon monoxide material is used for the starting source material to be evaporated. The silicon monoxide is evaporated from a source while oxygen is injected into the vacuum chamber 70 to create a controlled oxygen partial pressure in the deposition chamber. The oxygen combines with the silicon monoxide both on its way from the source to the target surface and at the target surface in order to convert it to silicon dioxide that forms a stable, transparent fused silica film on the deposition surface. During the evaporation, an electron stream partially ionizes the silicon monoxide material and the charged plates within the chamber accelerate the ionized silicon monoxide towards the substrate 10. This added energy from the accelerated ions is deposited at the growing $SiO_2$ layer on the target surface yielding more mobility and reactivity that improves the density and adhesion of the glass film while reducing the number of film pinholes, improving the film's weather resistance. After the glass deposition, the primary mirror 10 is then removed from the deposition chamber 70 and inserted into the solar energy conversion system.

The secondary mirror 14 may also be formed from a sheet of aluminum alloy in much the same manner as the primary mirror 10. That is, a sheet of aluminum alloy may be hot blow formed into a die that is precisely machined to the desired shape of the specular surface. Then, the convex surface of the secondary mirror is provided with a polymer layer applied to the formed aluminum member. Then a reflective metal layer is applied to the polymer layer and a thin glass layer is formed on the metal layer.

Figure 8:
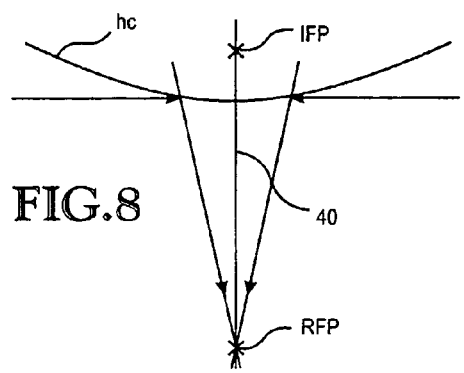
FIG. 8 is a diagram of a hyperbola showing its geometrical axis and showing a real focal point at one end of the axis and an imaginary focal point at the opposite end of the axis.
Figure 9:
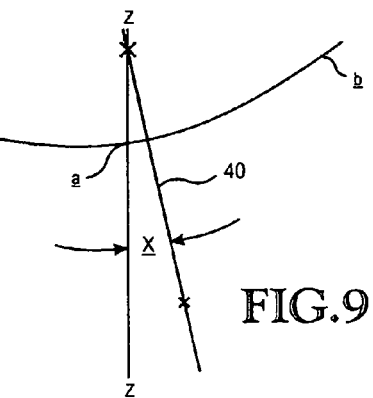
FIG. 9 is a view like FIG. 8, but showing the hyperbola and its geometric axis tilted by an angle x from the original position of the geometric axis, and showing a portion of the hyperbola extending from a point a to a point b.
Figure 10:
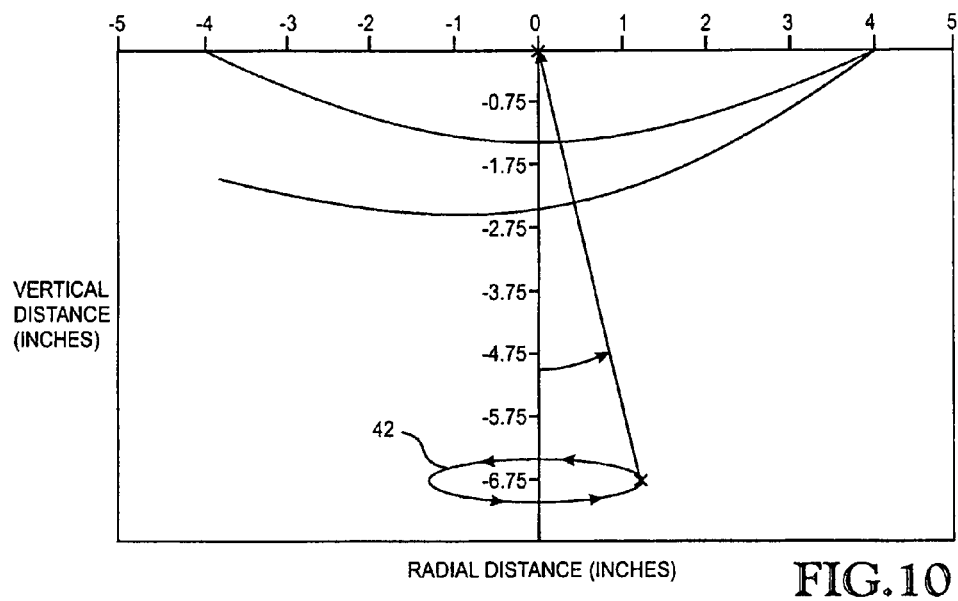
FIG. 10 is a view combining FIG. 8 and FIG. 9 and showing the real focal point of the rotated hyperbola section a-b transversing a circular path.
Figure 11:
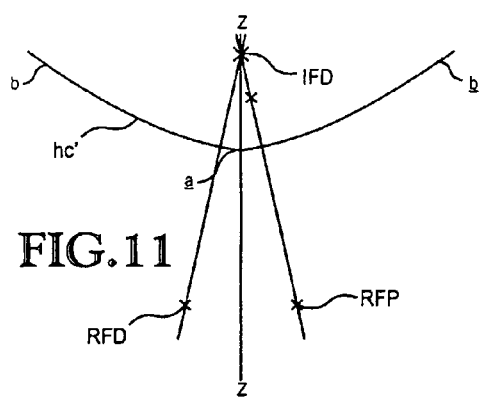
FIG. 11 is a view of a three dimensional shape formed by rotation of the hyperbolic section a-b about a new geometrical axis c-c.

Referring to FIGS. 8-11, the secondary mirror specular surface 16 can be determined in the following manner. Firstly, a hyperbolic curve hc is formed which has a geometrical center line axis 40, a concave side, a convex side, an imaginary focal point IFP intersecting the axis 40 on the concave side, and a real focal point RFP intersecting the axis 40 on the convex side. This axis 40 and the hyperbolic curve hc are pivoted in position about the imaginary focal point IFP in the manner shown by FIG. 9. When the hyperbolic curve hc is in this position, there is a point a on the curve which intersects the original position z-z of the axis 40. The segment a-b of the hyperbolic curve hc is then rotated in position about the axis z-z to form a surface of revolution that is generally hyperbolic except that it has been modified to such an extent that the real focal point RFP now lies on a circle 42 that surrounds the original axis z-z. This circle 42 is shown in FIG. 10. Accordingly, the rotated portion of the tilted hyperbola forms a surface that now focuses light energy onto an annular area.

Figure 12:
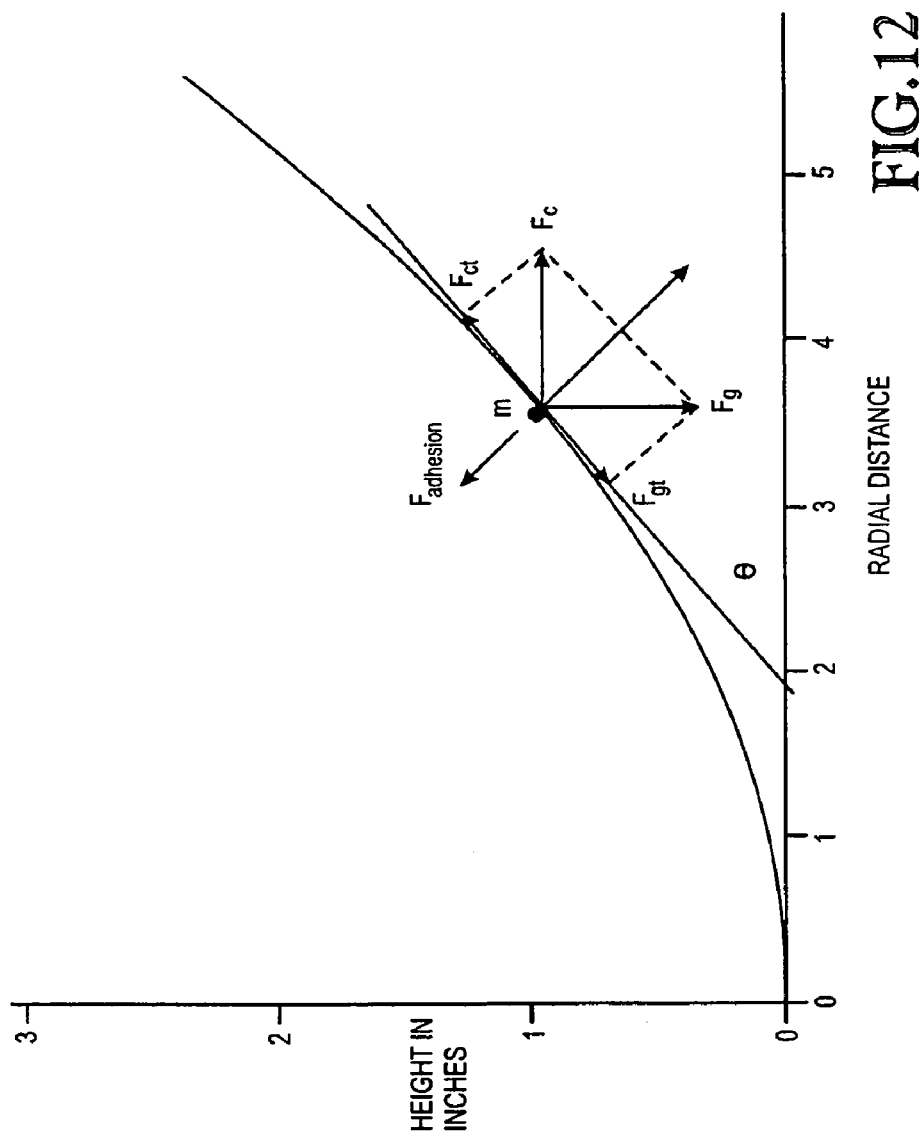
FIG. 12 is a diagram of the forces involved with spinning a smooth polymer coating onto the hyperbolic surface of the secondary mirror.

FIG. 10 superimposes FIG. 8 on FIG. 9 and shows the annulus 42 on which the solar energy is focused. Accordingly, the surface of revolution hc formed by tilting the hyperbolic curve 90 about the imaginary focal point IFP and then rotating the tilted curve about the original axis z-z is used as a basis of making the concave surface of a die against which the aluminum alloy sheet is moved by the use of a hot gas. After the metal body is shaped, the reflective surface is smoothed to a specular quality. Again, similar to the primary smoothing technique, a polymer with sufficient surface tension and low viscosity is applied to the surface. It is allowed to outgas a sufficient time for the surface tension to smooth the surface. Care is taken to allow the epoxy to level without running. This may be done by spinning the mirror 14 face down at a rotational speed such that the centrifugal force cancels that of gravity while the capillary adhesion force holds the film of polymer onto the surface of the part. This technique requires the smoothing polymer layer to be sufficiently thin to allow capillary adhesion to hold the thin layer upside down without dripping. The adhesion force needs to counteract both the component of the gravitational force and a component of the centrifugal force. FIG. 12 shows a schematic of spinning the hyperbolic surface hc; and shows the forces that must be balanced to maintain the polymer without movement. After the smoothing polymer layer has cured, the reflective surface is deposited using the technique described above for the primary mirror specular surface 12. A metal reflective layer is first deposited using energetic ions to deposit additional energy. A glass protective layer is deposited next, again using energetic ions of the glass evaporant to supply additional energy to the growing film. This completes the fabrication of the secondary mirror surface 16.

Figure 13:
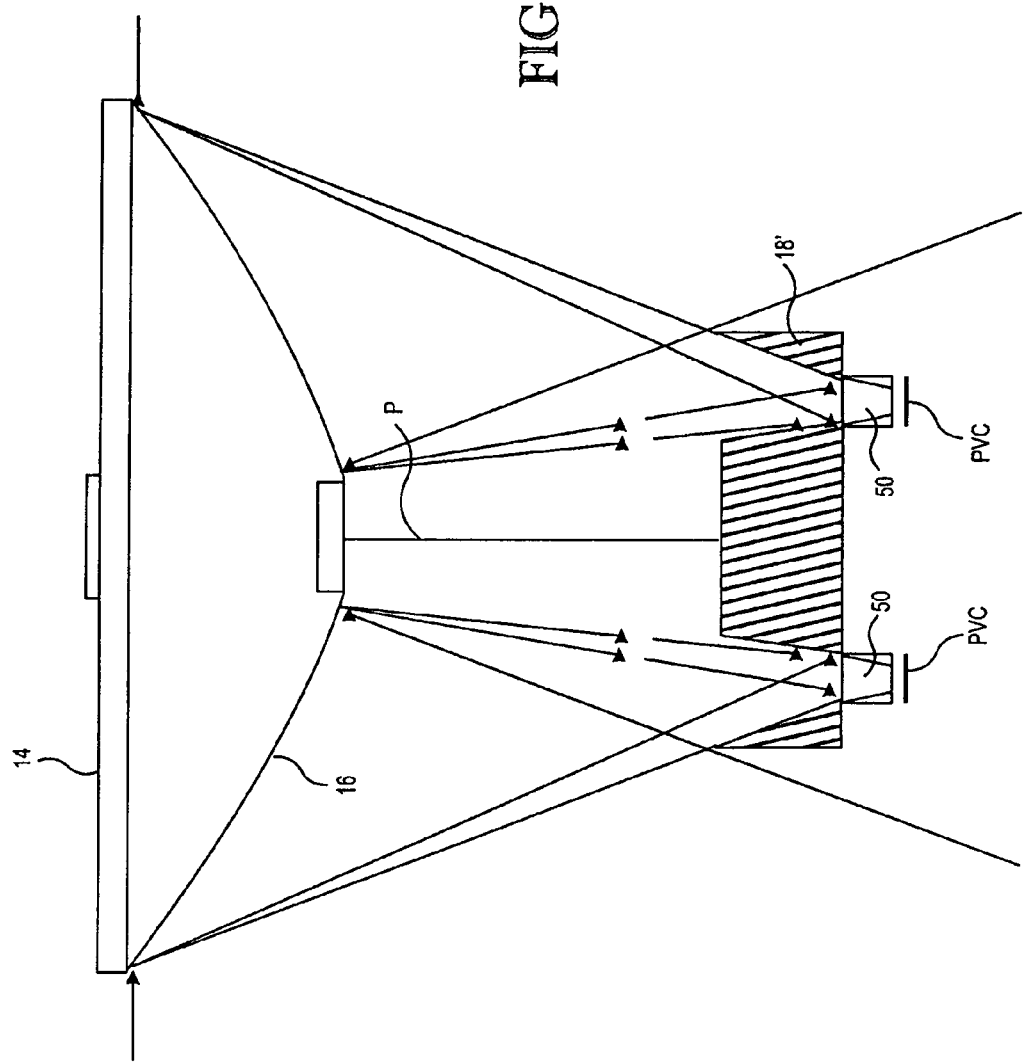
FIG. 13 is a cross sectional view of a lens/prism assembly spaced from the secondary mirror.

According to an aspect, an annular lens/prism assembly is positioned on the annular area formed by rotating the real focal point RFP. In FIG. 13, the ring of optical elements 50 is shown at the lower end of a downwardly converging annular opening in a member 18. This array of lens/prism elements 50 functions to redirect the ring focus from the primary and secondary mirrors into a ring of discrete rectangular areas. Each of the rectangles has its long axis oriented along lines radial to the original focused ring and at equal angles to each other. The advantage of this arrangement is that the high intensity, concentrated energy is now directed only to the active area of the photovoltaic, or other, energy converting elements. See photovoltaic cells PVC in FIG. 20. This has the added advantage that interconnecting wires, pathways, and other structures are not subjected to high intensity energy exposure and special design considerations are not required to prevent damage to those areas.

Figure 14:
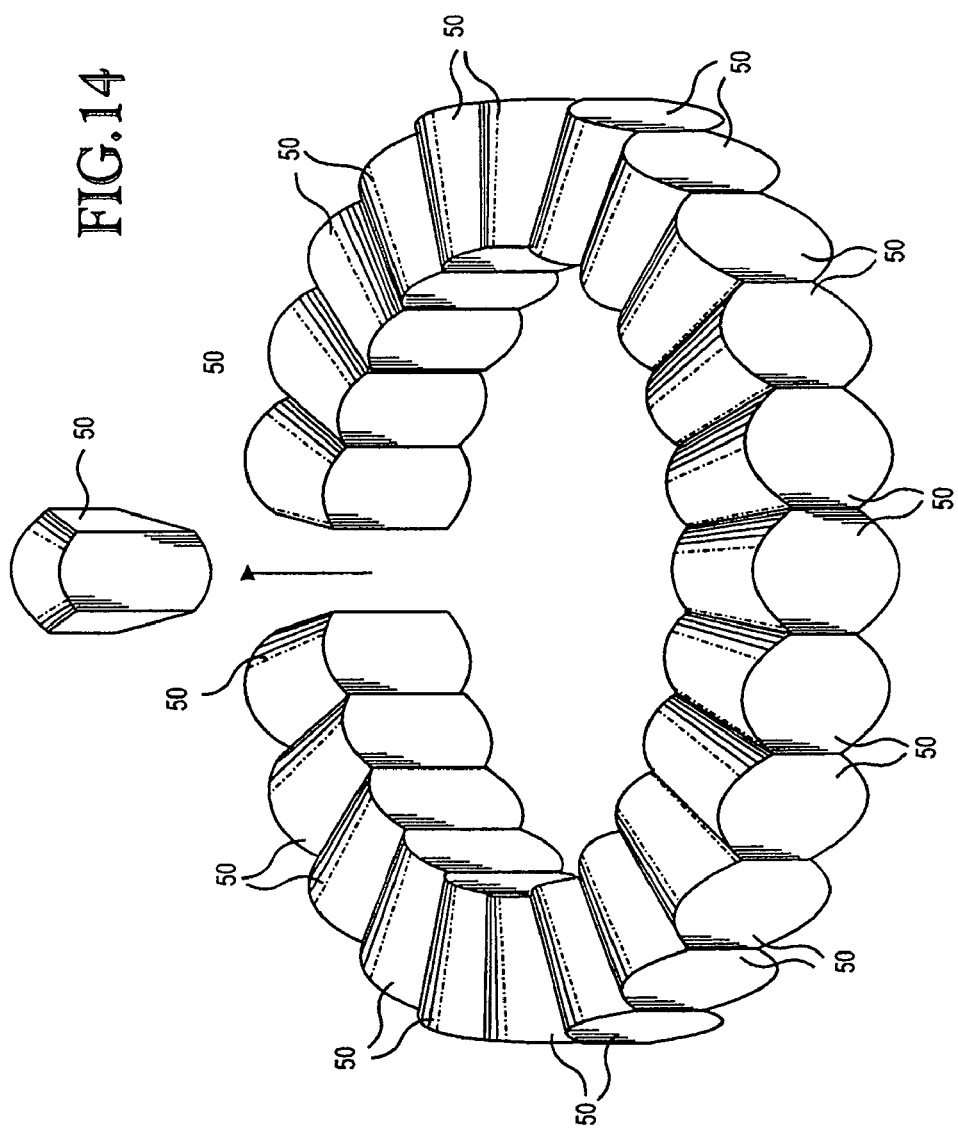
FIG. 14 is a pictorial view of a circular array of glass lens/prism elements, with one of the elements shown moved up from its position in the array.
Figure 15:
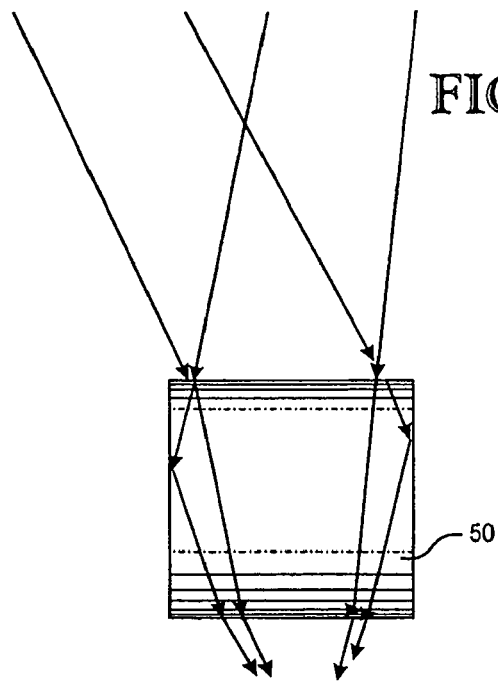
FIG. 15 is an enlarged side view of one of the lens/prism elements.
Figure 16:
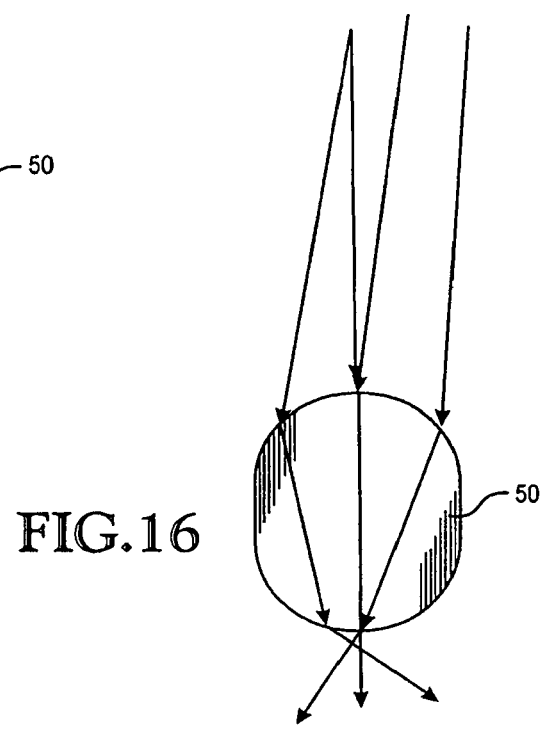
FIG. 16 is an end view of the lens/prism element of FIG. 14.
Figure 17:
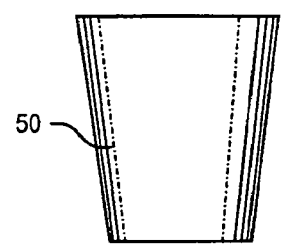
FIG. 17 is a top view of the lens/prism element shown by FIGS. 14 and 15.

The lens/prism elements 50 are unique in the way that they split the incoming light beam into two components in order to concentrate it and split it into narrow lines. The optical axis of each lens/prism element 50 is a perpendicular line extending vertically through the center of the elements 50 from top to bottom. In the radial dimension the elements 50 act as prisms with the geometry shown in FIGS. 14-17. The elements 50 act as prisms to rays incident at off-axis angles in the radial direction that penetrate into the element and are reflected from the flat ends of the elements 50 by total internal reflection. The optical performance of the prism is illustrated by the ray traces in FIGS. 15 and 16. The elements 50 act as double-convex lenses to rays incident at off-axis angles in the circumferential direction. FIG. 16 illustrates the geometry of the double-convex lenses. The optical performance of the lenses is shown by the ray traces in FIG. 16. The circumferentially off-axis rays that penetrate into the element 50 are refracted to a focus beneath the element 50. The thickness of the double-convex lens can be varied to optimize their performance in a good design. For example, the simplest form is when the two convex surfaces form a complete circle or cylindrical lens. In this case, for most practical glasses, the beam is focused at some distance between the lower surface of the lens. If the thickness of the lens is increased, the rays can be made to focus inside the glass material. In the example shown by FIG. 16, the rays are focused at the lower surfaces of the lenses. In this way the performance of the lenses can be optimized for a particular system. By the unique combination of the prism and lens functions, the continuous ring of concentrated sunlight on the top surfaces of the lenses is formed into narrow rectangular focal spots formed just beneath the lenses. Finally, the sides of the lens/prism elements 50 are tapered as shown in FIG. 17, so that they can be fitted into an annular array as shown in FIG. 14.

By breaking the incident light rays into two components, one radial and one circumferentially, the spread of angles that the prisms and the lenses individually must operate on is limited to a much smaller range and allows pointing error tolerance for the system even at the very-high concentration levels of the CHP system.

FIG. 18 is a schematic of the electrical system. The particular system that is illustrated includes four solar energy collection systems I, II, III, IV connected in parallel to electrical conduits leading to a customer hookup CH. Each of the four collector systems I, II, III, IV include an array of twenty-four series connected/parallel GaAs Photovoltaic Cells which are adapted to generate 26 volts at no load and 24 volts at 10 amps. The circuit includes eight 15-amp circuit breakers B and a ground wire GW. Positive and negative conductors lead from the circuit breakers to a user's electrical load. The system includes a microcomputer for tracking drive and control and a small storage battery for startup.

The photovoltaic cells PVC serve a dual function in the system. They absorb the concentrated sunlight and converts a portion of it to electricity and a portion to heat, or thermal energy. Thus, it serves as both an electricity generator and a heat generator in the system. In order to accomplish these two roles efficiently, the photovoltaic cells PVC must be fabricated from semiconductor materials with sufficiently wide band gap to maintain efficient electrical conversion at relatively high temperatures. In general, the wider the band gap of the semiconductor material, the less the photovoltaic cells efficiency will be degraded with rising temperature. Thus, a tradeoff is required for the application being considered depending on the relative importance of electricity production and heat production. For example, if a GaAs Photovoltaic Cell PVC is used, then the system can produce heat at temperatures up to about 100° C. while still maintaining an electrical conversion efficiency that is approximately 95% of its efficiency at 25° C. Thus, the system lends itself well to wide band gap photovoltaic cells having both single and multiple tandem junctions. The inventors have determined that, the cost of photovoltaic cells made from wide band gap materials and in multi-junction configurations has precluded their use in terrestrial applications. For this reason, the very-high intensity produced by the concentrator system disclosed herein allows the use of small, economic area of photovoltaic cells. For photovoltaic cells PVC to operate efficiently at very-high light intensities, a unique design is required. FIG. 19 illustrates a very-high intensity solar cell design. The cells PVC have long and narrow active areas for two reasons. First, it corresponds to the illumination pattern provided by the tertiary concentrator lenses 50 shown in FIG. 14. Secondly, it provides a very short path length for conducting the photo-generated current away from the cells PVC. Photovoltaic cells PVC under high light concentration generate very large currents at low voltage; therefore, any series resistance in the cell would drop the voltage and, in turn, the efficiency of the cells. The current from the high-intensity cells is collected and conducted off of the cells by means of a pattern of electrically conducting metal grids G overlaying the active areas of the cell. The series resistance in the grids G is proportional to the length of the grids. For this reason, the long narrow cell design with its electrical bus bar BB running parallel to the long dimension of the cells PVC permits the necessary short conductor grids G.

Another constraint on the grid lines G is that they cover as small a portion of the active area as possible so as to not shadow the active area of the cell PVC and prevent light from entering the cell PVC. The electrical resistance of the grids G is also proportional to their width and height. For this reason, making the cells PVC tapered, getting wider as they approach the bus bar and the current from the cells PVC increasing can help to optimize the low resistance with the need for low shadowing. Making the grids G as thick as possible can also reduce the required width of the grids G. To those skilled in the art, many other grid-bus bar designs for minimizing resistance and maximizing active area will be apparent. Typical metals for use in the grids and bus bars are gold, silver or copper.

The photovoltaic cells PVC are mounted on a special, electrically insulating, thermally conducting substrate 120. The substrate 120 consists of a thin alumina sheet 122 with gold plated copper cladding 124 bonded to each side. At the top side of the substrate, the cladding 124 is etched to form a circuit pattern for making electrical interconnects 126 between the photovoltaic cells PVC that are bonded to the etched copper circuit pattern as shown in FIG. 20. In series connected strings, photovoltaic cells PVC are subject to damage due to reverse bias breakdown if part of the string is being illuminated due to a partial shading of the concentrator. Every two photovoltaic cells PVC in series string of twenty-four cells are protected from reverse bias breakdown by a diode D connected in opposite polarity to the two photovoltaic cells PVC.

Figure 21:
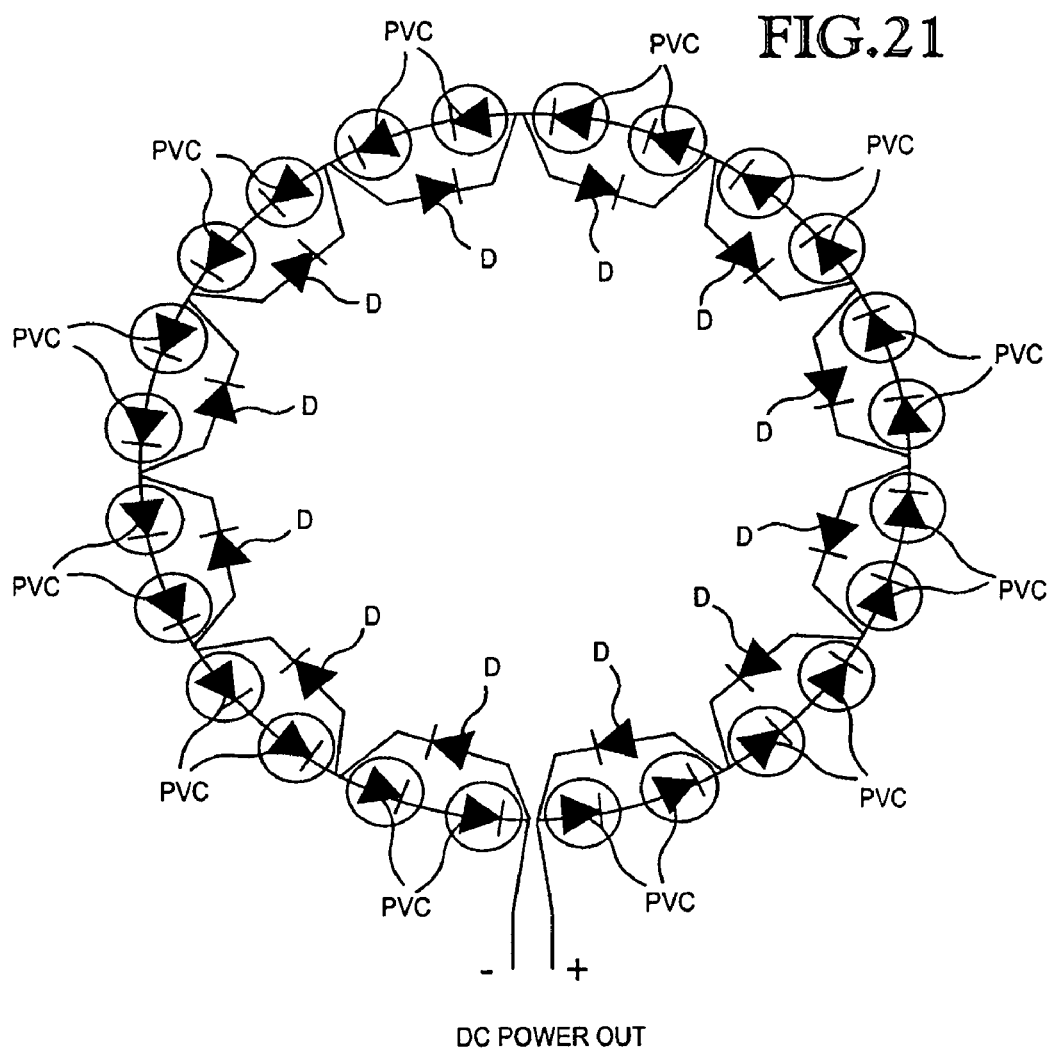
FIG. 21 is an electrical schematic of the photovoltaic cell array shown in FIG. 20.

FIG. 21 illustrates the electrical connection of the photovoltaic cell and diode arrays. The electrical power is conducted off the array by two copper leads attached at the center of the annular board as shown in FIG. 20. The cells PVC are cooled by a stream of circulated water which contacts the back of the gold plated copper cladding on the back of the ceramic circuit board. In this way the thermal energy is extracted from the cells and delivered to a heat exchanger located at the base of the concentrator.

Figure 22:
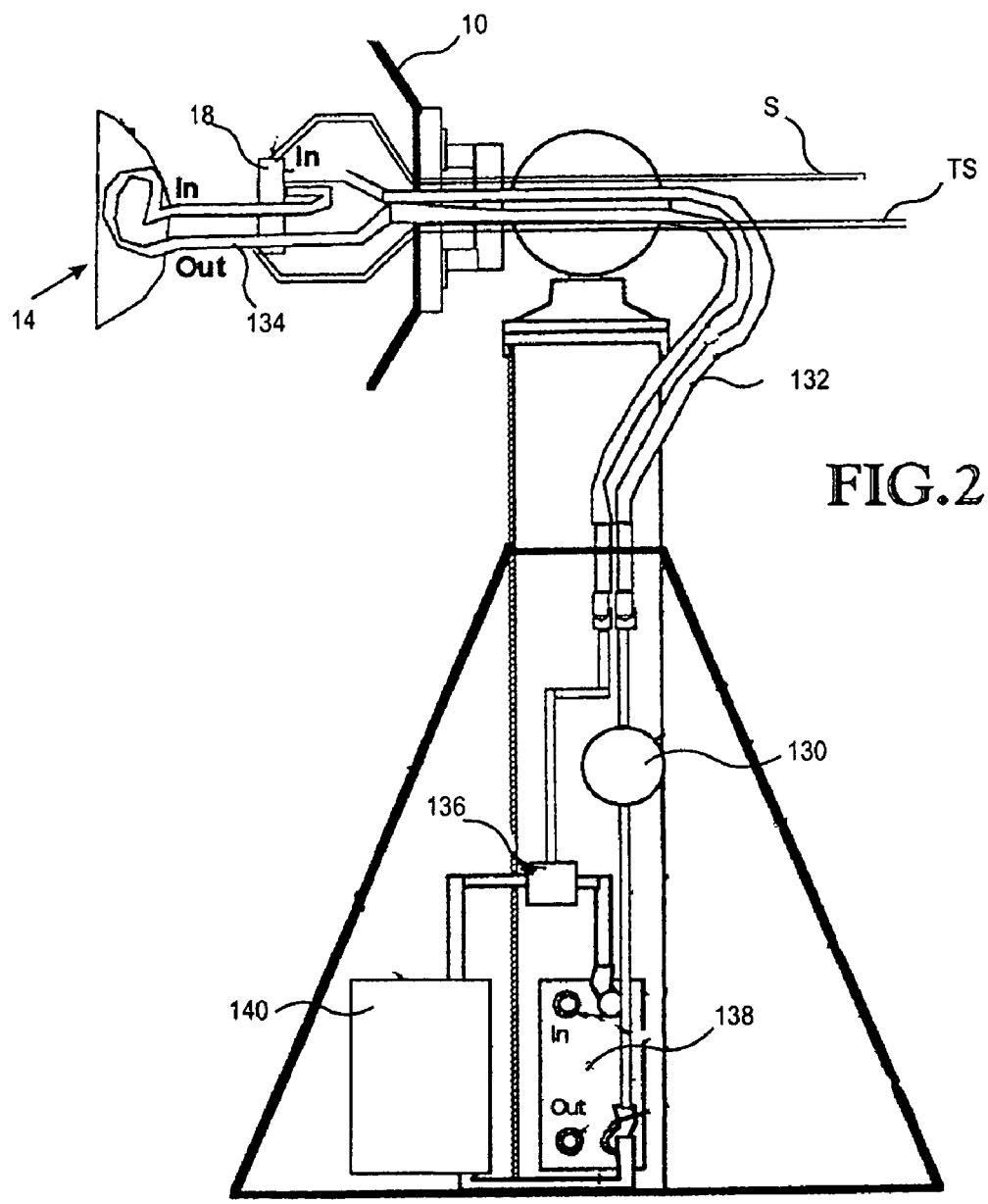
FIG. 22 is a schematic diagram of the thermal system and its relationship to the other components of the overall system.

FIG. 22 illustrates the overall thermal collection and control system.

FIG. 22 shows the secondary mirror 14 being cooled by a liquid which flows from a circulation pump 130 to an "in" conduit 132 that leads into the base of the concentrator 18 and from it through the post P into the hollow interior of the secondary mirror 14. The heated coolant flows out from the hollow interior of the secondary mirror 14 through an "out" conduit 134 which extends back through the post P and onto a two-way selector solenoid valve 136. If the thermal energy is to be delivered to an external load, then the valve 136 is operated to deliver the heated coolant to a liquid-to-liquid heat exchanger 138. The thermal energy is transferred to the user's fluid for transport to the desired thermal load. If the external thermal load does not require any portion of the thermal energy, then the valve 136 is operated to direct the coolant to a liquid-to-air heat exchanger 140 where it is transferred to the ambient air. Thermocouple sensors TS mounted on the substrate for the photovoltaic cells PVC monitor the temperature of the photovoltaic cells PVC. If the cell temperature rises before a preset threshold, then the concentrator array is directed by the onboard microcomputer to track the solar energy collector(s) away from the sun in order to prevent damage to the system. As a backup against computer failure, a thermal switch S is mounted on the housing of the receiver base. This normally open thermal switch S is connected in parallel with the vertical drive gear motor. If the temperature rises too high, the switch S closes and provides continuous dc power to the motor with the proper polarity to drive the concentrator array to a ground facing position until the thermal problems can be analyzed and corrected.

FIGS. 23-28 relate to the control system composed of the elements marked CS in FIG. 3. This system comprises a sun sensor that supplies sun position signals to a microcomputer that processes the information and sends control signals to gear motors that drive the concentrators and holds them locked onto the sun to an accuracy of +/−0.1°. The microcomputer also monitors water temperature and adjusts the flow rate in the coolant loop to achieve the desired operated temperature. The microcomputer further serves to shut the system down at night and position the concentrator dishes to face the ground, wake the system up in the morning and acquire the sun, monitor the photovoltaic cell temperatures and drive the concentrators off sun if the cells overheat, monitor wind speed and rotate the concentrator dishes to face down (edge-on to the wind) if wind speed exceeds at threshold amount. The major functions of the sensor and control system are described in greater detail below.

The CHP solar concentrator system requires several specific functions from its sun sensing system. Firstly, the tracking system used two-axis active closed loop continuous sensing of the sun and does not depend on a clock and timing algorithm for finding and tracking the sun. Since it uses no timing algorithm, the sensor senses the sun's position from anywhere in a 180° solid angle, or hemisphere. Once the sun is found, the sun position sensor SPS provides sufficiently sensitive signals to allow pointing at the sun with +/−0.1° of accuracy. The sensor also discriminates between direct solar illumination and the light from bright cloud rims and other interference, which may be due to stray reflected light or ground based light sources. Finally, the sensor and tracking system may be economical enough for commercial sales. Heretofore, no system existed that met all of the above criteria.

The sensor SPS is based on a different physical phenomenon than that of conventional sensors. The sensor SPS lends itself better to protection from stray light and provides more sensitive detection of small angular offsets in pointing accuracy. Most of the available sensors may use some sort of tall column with photo sensors attached to its four sides. As the column points directly at the sun, the cells are turned edge on to the sun and no signal is produced. As they turn away from the sun, the cells on one side of the column are illuminated yielding a signal while the cells on the opposite side are shaded and yield no signal. Another type of sensor utilizes cells mounted flat in the bottom of a collimating tube. The trouble with these designs is that the signals produced are highly non-linear and sensors are either very prone to elimination by stray light (columnar type) or they are not amenable to sensing the sun at large error angles (collimating tube type).

The sensor SPS is based on non-linear dependence to the angle of incidence of reflectance and transmittance of light at the surface of photovoltaic cells and in dielectric materials such as glass in order to overcome the difficulties described above. FIG. 23 shows a typical reflectance curve for glass as a function of the angle of incidence of incoming light. FIG. 24 shows the same effect manifested in the transmittance of light into a photovoltaic cell. The current generated in a photovoltaic cell is directly proportional to the amount of light transmitted into it. To generate the data presented in FIG. 24, a glass covered photovoltaic cell was placed beneath the beam of collimated light and rotated through one hundred and eighty degrees (180°), beginning at −90° (edge-on to the light beam facing in one direction) through 0° (normal incidence) to +90° (edge-on facing in the opposite direction). As can be seen, the signal produced is non-linear with the rate of change being much greater at larger angles off normal than its angles off-axis. This non-linear cell current response with angle of incidence can be used to generate a sun sensor that is highly sensitive to angular error from normal incidence and produces a linear signal that increases with increasing off-axis error angle.

Figure 25:
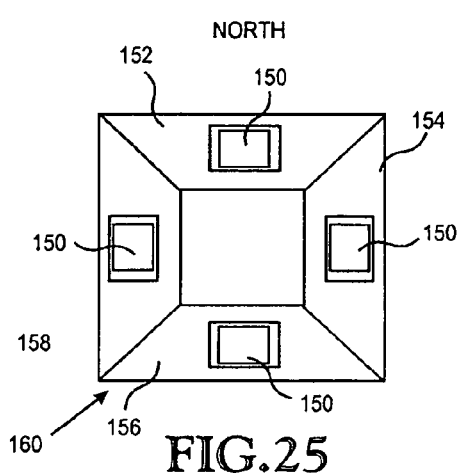
FIG. 25 is a top plan view of an array of sensors which is very sensitive to small angular changes.
Figure 26:
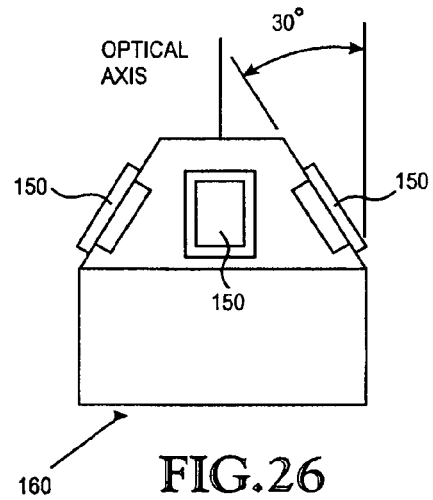
FIG. 26 is a side view of the array of sensors shown by FIG. 25.
Figure 28:
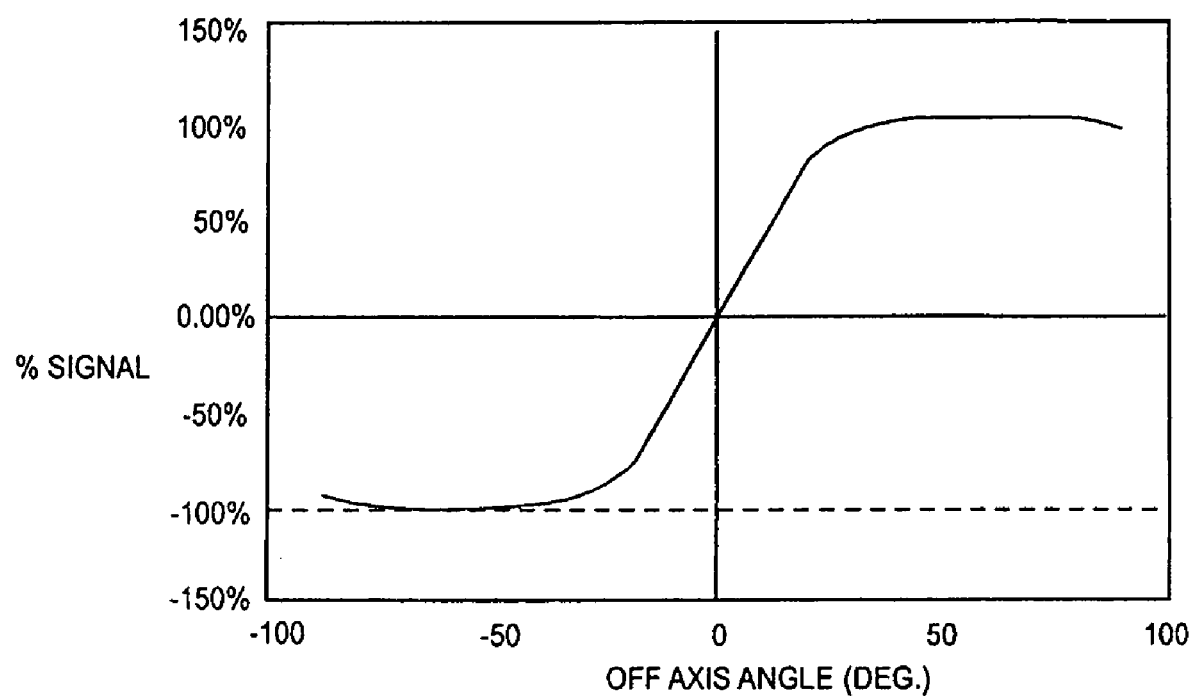
FIG. 28 is a graph showing a typical signal generated by the sun sensor as a function of error angle.

FIGS. 25 and 26 show a physical embodiment of the sun sensor. Small, glass covered photovoltaic cells 150 are mounted on the angled sides 152, 154, 156, 158 of a truncated pyramid 160. When the sensor is tracking "on-sun", the sun is aligned directly over the truncated pyramid 152, 154, 156, 158 of the sensor whose axis is defined by a vertical line passing through the center of the pyramid. This line is labeled optical axis in FIG. 26. As the sensors tilt away from the sun, the angle of incident light hitting the glass-colored sensors 150 is changed, becoming steeper on the side away from the sun and less steep on the side nearest the sun. If the side angles are chosen so that the cells are operating near the on-set of non-linear reflectance (about 60°) then the light entering the sun-facing cells increases rapidly while the light entering the cell facing away from the sun decreases rapidly. The angles of the sides are optimized to yield the maximum and most linear error signal. FIG. 28 illustrates the typically produced error signal. The signal has excellent magnitude, is very sensitive to small angular changes, is very linear over a large range of angles about normal, and increases in magnitude proportional to the angle off normal.

Figure 27:
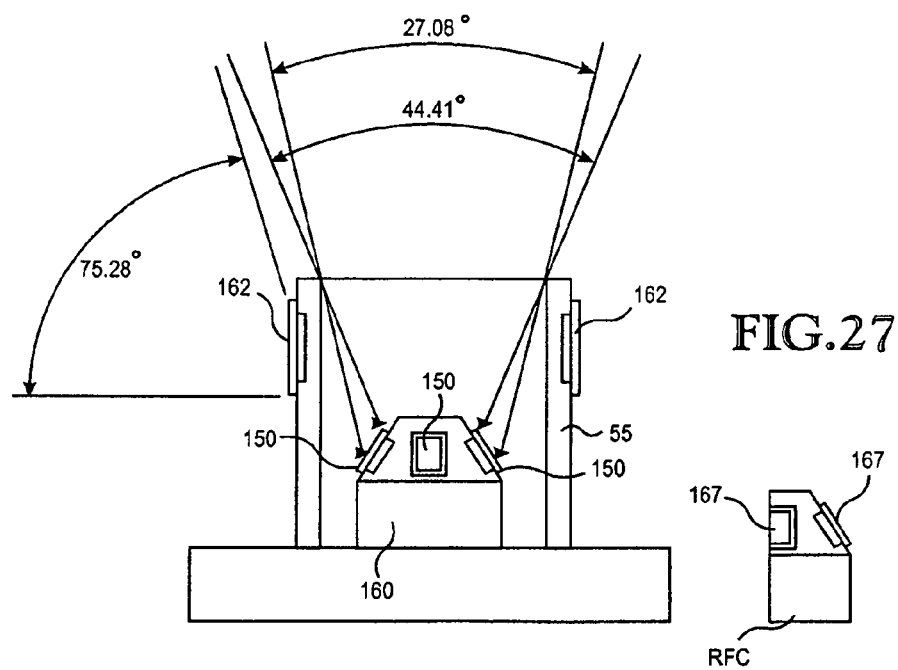
FIG. 27 is a cross sectional view of an entire sun sensor system, showing a rear sun sensor assembly, a coarse sensor assembly and a fine sensor assembly.

The non-linear reflectance based sun sensor is extremely sensitive to small angular errors about its normal which allows it to hold the concentrator locked on sun to a very tight tolerance, +/−0.1° being typical. The low profile of the sensor enables the use of a shadow shield ss to protect the sensor from stray reflected light or local light sources. FIG. 27 shows an axial sectional view of a typical shield embodiment. The fine sensor assembly is located at the bottom of a cylindrical shadow shield ss. The shield ss limits the sensor to a fairly narrow cone of entrance angles so that it becomes the "fine" sensor of the system. For coarse sensing, four photovoltaic cells 162 are located on the outside of the shadow shield ss. These four cells are arrayed ninety degrees (90°) apart around the circumference of the shadow shield. This configuration provides two opposing pairs of cells for north-south and east-west sensing respectively. In case the sun is located behind the concentrator array, there are also two rear facing photovoltaic cell sensors RFC.

The signals from the fine sensors, coarse sensors, and the rear-facing sensor are processed by the control microcomputer. If there is little or no signal on the fine and coarse sensors but there is signal on the rear-facing sensor, then the computer directs the gear motors to drive the system, westward until the coarse sensors pick up signal. At this point, the computer transfers control to the coarse signals and the concentrator drive system will seek the sun in both horizontal and elevation directions. When the computer detects sufficient signal from the fine sensors, then it transfers control to the sensors for locking on-sun and maintaining the desired tracking tolerances in each axis. In this way, a highly sensitive, highly accurate tracking system that is immune to stray light signals is achieved. The remaining problem "cloud chasing" due to scattered light from bright cloud rims is solved by software. The computer is instructed to ignore signals that are not up to a threshold value typical of direct sunlight.

The onboard computer is the heart of the control system. In addition to handling the tracking signals and controlling the tracking motors, the computer handles a variety of other signals from its internal clock, limit switches, thermocouples, and a wind sensor to keep the system operating safely and efficiently. The limit switches are located in the motor drive trains and are tripped when the motion of the concentrator reaches the extreme limits of travel in either direction and in both axis. For example, at the end of the day, the horizontal drive system rotates from its westerly, sundown position back to the east. It trips the east limit switch locating the concentrator for beginning the day's travel the next morning. Usually (except at summer solstice) in the evening and the system does not drive to the extreme westerly position so an internal clock is used to signal the computer to drive back to its easterly "home" position at a program time when energy collection is finished for the day. Similarly, at the program time in the evening, after the system reaches its easterly "home" position, the computer drives the concentrator to face down. The computer also samples signals from a wind sensor and, if the wind velocity exceeds a programmed threshold, then the computer directs the concentrators to the ground-facing position, i.e. horizontal to the wind until the wind signal drops below the threshold value.

The computer also monitors a thermocouple located on each photovoltaic cell array and if an array indicates a temperature exceeding a programmed threshold, then the concentrator is driven to the earth-facing position until the problem can be evaluated and corrected as necessary. As a backup, in case the computer malfunctions, a thermal mechanical switch is located on the photovoltaic receiver body. If the receiver body reaches a high enough temperature to trip the thermal-mechanical switch, then it overrides the computer and supplies power directly to the elevation drive motor to drive the concentrators to the ground-facing position.

For normal operation, the computer monitors the coolant fluid temperature and controls the pump flow rate to adjust the fluid temperature to a program value. If the temperature is rising and the fluid flow rate is at its maximum, then it is assumed that the external thermal load cannot accept all the thermal energy being generated and the fluid flow is diverted by a solenoid valve to the liquid-to-air heat exchanger to control the fluid temperature.

In another embodiment, the photovoltaic cell array can be replaced by a light absorber to absorb the concentrated sunlight and convert it directly to heat and transfer it to a desired application. The desired application can vary from domestic hot water, water purification, commercial processing, or absorption air conditioning. The heat can also be used directly to (1) drive heat engines such as Stirling engines, (2) super heat steam to drive a steam engine or turbine, (3) to fuel a thermal electric generator, or (4) drive any other type of thermal engine or heat application.

It is within the scope of the various embodiments to direct a laser beam into the parabolic dish in a direction parallel to its optical axis and then use photovoltaic cells that are sensitive to the laser photons to convert the laser beam to electrical power. In this manner, power can be transmitted over long distances without the use of electrical wire. It is also within the scope of the various embodiments to direct a modulated laser beam into the concentrator system parallel to its optical axis and use a detector sensitive to the laser photons to detect and analyze the modulated signal. In this way the system can be used as the receiver in a laser transmitted communication system. Herein, "light energy" is generic to sunlight (soar energy), laser beams and other light beams.

The various embodiments that have been illustrated and/or described are only examples and, therefore, are non-limitive. It is to be understood that many changes in the particular structure, materials and features may be made without departing from the spirit and scope of the present disclosure. Therefore, it is our intention that the patent rights not be limited to the particular embodiments that are illustrated and described herein, but rather are to be determined by the following claims, interpreted according to accepted doctrines of patent claim interpretation, including use of the doctrine of equivalents.

What is claimed is:

1. A sun position sensor, comprising:
   a base;
   a cylindrical shadow shield extending upwardly from the base, the shield including an upper end, a cylindrical inner surface, and an outer surface;
   a sensor support having a lower portion connected to the base inside the shadow shield and an upper portion in the form of a truncated pyramid, the upper portion having four sloping sides positioned approximately ninety degrees)(90°) apart;
   four photovoltaic cells mounted on the support, one on each sloping side of the truncated pyramid at an optimal angle to exploit the nonlinear absorbtance of the photovoltaic cells; and
   four photovoltaic cells mounted on the outer surface of the shadow shield and oriented approximately ninety degrees (90°) apart and mounted such that a sensing surface is substantially perpendicular to the base.

2. The sensor assembly of claim 1, wherein the four sides of the truncated pyramid slope approximately thirty degrees (30°) from a vertical axis that is perpendicular to the base which is optimal for exploiting the nonlinear absorptance of the photovoltaic cells.

3. The sensor assembly of claim 1, wherein each photovoltaic cell is glass-covered, whereby angular properties of the glass cause a non-linear angular photocurrent response of the photovoltaic cell.

4. A positional sensor for a solar energy collection device, comprising:
   a fine sensing device having first light-sensitive sensors supported above a base so that adjacent first light-sensitive sensors are oriented in mutually orthogonal directions at a sensor height above the base, the first light-sensitive sensors positioned at oblique angles relative to the base; and
   a coarse sensing device having a light-opaque shield surrounding the first light-sensitive sensors that extends outwardly from the base to a height that is greater than the sensor height, the shield further including second light sensing devices directed outwardly from the shield and arranged so that adjacent second light-sensitive sensors are oriented in mutually orthogonal directions and a sensing surface of the second light sensing devices is substantially perpendicular to the base.

5. The positional sensor of claim 4, wherein the solar energy collection device comprises a concentrator array, and further wherein the fine sensing device and the coarse sensing device are positioned on a concave side of the concentrator array; and further comprising a sensing device positioned on a convex side of the concentrator array that is operable to detect an approximate direction of solar incidence.

6. The positional sensor of claim 4, wherein the first light-sensitive sensors and the second light-sensitive sensors comprise photovoltaic cells that are overlaid by a respective layers of a transparent glass.

7. The positional sensor of claim 4, wherein the first light-sensitive sensors are oriented at oblique angles of approximately 60 degrees relative to the base to optimally exploit the nonlinear absorptance of the sensors.

8. The positional sensor of claim 4, further comprising a rectangular pyramidal-shaped structure having an axis that extends through an apex of the rectangular pyramidal-shaped structure, wherein the first light-sensitive sensors are positioned on faces of the rectangular pyramidal-shaped structure, and further wherein the first light-sensitive sensors are inclined at an angle of approximately 30 degrees relative to the axis to optimally exploit the nonlinear absorptance of the sensors.

9. The positional sensor of claim 4, wherein the light-opaque shield is configured to limit a viewing angle of the first light-sensitive sensors to a range of approximately 27 degrees and 45 degrees.

10. A control system for a solar energy collection device, comprising:
    a processing system; and
    a positional sensor operably coupled to the processing system, the positional sensor further comprising:
    a sensor support coupled to a base and configured to orient adjacent first light sensing devices in mutually orthogonal directions at a predetermined sensor height above the base, the sensor support further configured to position the light sensing devices at oblique angles relative to the base; and
    a shield coupled to the base and surrounding the sensor support that extends outwardly from the base to a height that is greater than the sensor height, the shield further including second light sensing devices directed away from the sensor support and arranged to orient adjacent second light sensing devices in mutually orthogonal directions and mounted such that a sensing surface is substantially perpendicular to the base, wherein the positional sensor is configured to generate positioning signals responsive to a direction of solar incidence, and further wherein the processing system is operable to receive the positioning signals and to control at least the azimuthal and elevational position of the solar energy collection device in response to the positioning signals.

11. The control system of claim 10, further comprising:
    an azimuthal drive system operably coupled to the processing system; and
    an elevational drive system operably coupled to the processing system, the azimuthal drive system and the elevational drive system being configured to direct the solar energy collection device in a direction of maximum solar incidence.

12. The control system of claim 11, wherein the processor is configured to acquire the direction corresponding to a maximum solar incidence, and to control at least one of the azimuthal drive system and the elevational drive system to continuously direct the solar energy collection device in the direction of maximum solar incidence during a daylight period.

13. The control system of claim 12, further comprising a velocity sensor operably coupled to the processing system and configured to sense an air velocity proximate the solar energy collection device and generate velocity signals in response to the sensed air velocity, wherein the processing system is configured receive the velocity signals and to command the azimuthal drive system and the elevational drive system to position the solar energy collection device in a predetermined position when the sensed air velocity exceeds a predetermined value.

14. The control system of claim 10, further comprising a thermal sensor operably coupled to the processing system and configured to sense a temperature at a selected location in the solar energy collection device, wherein the thermal sensor is operable to detect an overheat condition.

15. The control system of claim 14, wherein the thermal sensor is positioned proximate to at least one of a photovoltaic assembly and a light absorbing assembly in the solar energy collection device.

16. The control system of claim 14, wherein the thermal sensor includes at least one of a thermocouple and a thermally-actuated switch.

17. The control system of claim 10, wherein the solar energy collection device comprises a concentrator array, and further wherein the first light sensing devices and the second light sensing devices are positioned on a concave side of the concentrator array; further comprising a sensing device on a convex side of the concentrator array and coupled to the processing system and operable to detect an approximate direction of solar incidence.

18. The control system of claim 10, wherein the first light-sensing devices and the second light-sensing devices comprise photovoltaic cells that are overlaid by a respective layers of a transparent glass, whereby angular properties of the glass cause a non-linear angular photocurrent response of the photovoltaic cell.

19. The control system of claim 10, wherein the first light-sensing devices are oriented at oblique angles of approximately 60 degrees relative to the base.

20. The control system of claim 18, wherein the first light-sensing devices and the second light-sensing devices are configured to detect an ambient illumination level, and the processing system is operable to determine if the ambient illumination level is above a minimum threshold level.

* * * * *

UNITED STATES PATENT AND TRADEMARK OFFICE
CERTIFICATE OF CORRECTION

PATENT NO. : 7,893,391 B2
APPLICATION NO. : 12/484429
DATED : February 22, 2011
INVENTOR(S) : William E. Horne et al.

It is certified that error appears in the above-identified patent and that said Letters Patent is hereby corrected as shown below:

In column 15, line 38, in Claim 1, delete "degrees)(90°)" and insert -- degrees (90°) --, therefor.

In column 15, line 41, in Claim 1, delete "absorbtance" and insert -- absorptance --, therefor.

Signed and Sealed this
Nineteenth Day of April, 2011

David J. Kappos
*Director of the United States Patent and Trademark Office*